United States Patent
Sakai et al.

(10) Patent No.: US 6,689,699 B2
(45) Date of Patent: Feb. 10, 2004

(54) METHOD FOR MANUFACTURING A SEMICONDUCTOR DEVICE USING RECIRCULATION OF A PROCESS GAS

(75) Inventors: Itsuko Sakai, Yokohama (JP); Takayuki Sakai, Chofu (JP); Tokuhisa Ohiwa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 09/955,083

(22) Filed: Sep. 19, 2001

(65) Prior Publication Data

US 2002/0034880 A1 Mar. 21, 2002

(30) Foreign Application Priority Data

Sep. 21, 2000 (JP) .......................... 2000-287716
Jan. 19, 2001 (JP) .......................... 2001-012257

(51) Int. Cl.[7] .............................. H01L 21/00
(52) U.S. Cl. ........................... 438/710; 438/909
(58) Field of Search .................. 137/565.23; 95/8; 438/710

(56) References Cited

FOREIGN PATENT DOCUMENTS

| JP | 6-252095 | 9/1994 |
|---|---|---|
| JP | 6-327924 | 11/1994 |
| JP | 9-251981 | 9/1997 |
| JP | 10-125657 | 5/1998 |
| JP | 2000-9037 | 1/2000 |

OTHER PUBLICATIONS

Ohiwa et al., "A New Gas Circulation RIE" 1999 IEEE International Symposium on Semiconductor Manufacturing, Oct. 1999, pp 259–262.*
Raoux et al., "Remote microwave plasma source for cleaning chemical vapor deposition chambers: Technology for reducing global warming gas emissions", Journal of Vacuum Science Technology B, Mar./Apr. 1999, vol. 17, No. 2, pp 477–485.*
Masashi Saito et al., "Processing Apparatus", Ser. No. 09/686,370, f iled Oct. 12, 2000.

* cited by examiner

Primary Examiner—William David Coleman
(74) Attorney, Agent, or Firm—Finnegan, Henderson, Farabow, Garrett & Dunner, L.L.P.

(57) ABSTRACT

There is disclosed a semiconductor processing apparatus comprising a process chamber treating a substrate, a process gas feeder feeding a process gas to the process chamber, a first vacuum pump exhausting the process chamber, a second vacuum pump inhaling gas on an exhaust side of the first vacuum pump, and a circulation path circulating at least a part of the process gas exhausted from the process chamber via the first vacuum pump into the process chamber, wherein the circulation path is provided with a dust trapping mechanism, the dust trapping mechanism being capable of substantially maintaining a conductance of the circulation path before and after the capture of dust.

20 Claims, 13 Drawing Sheets

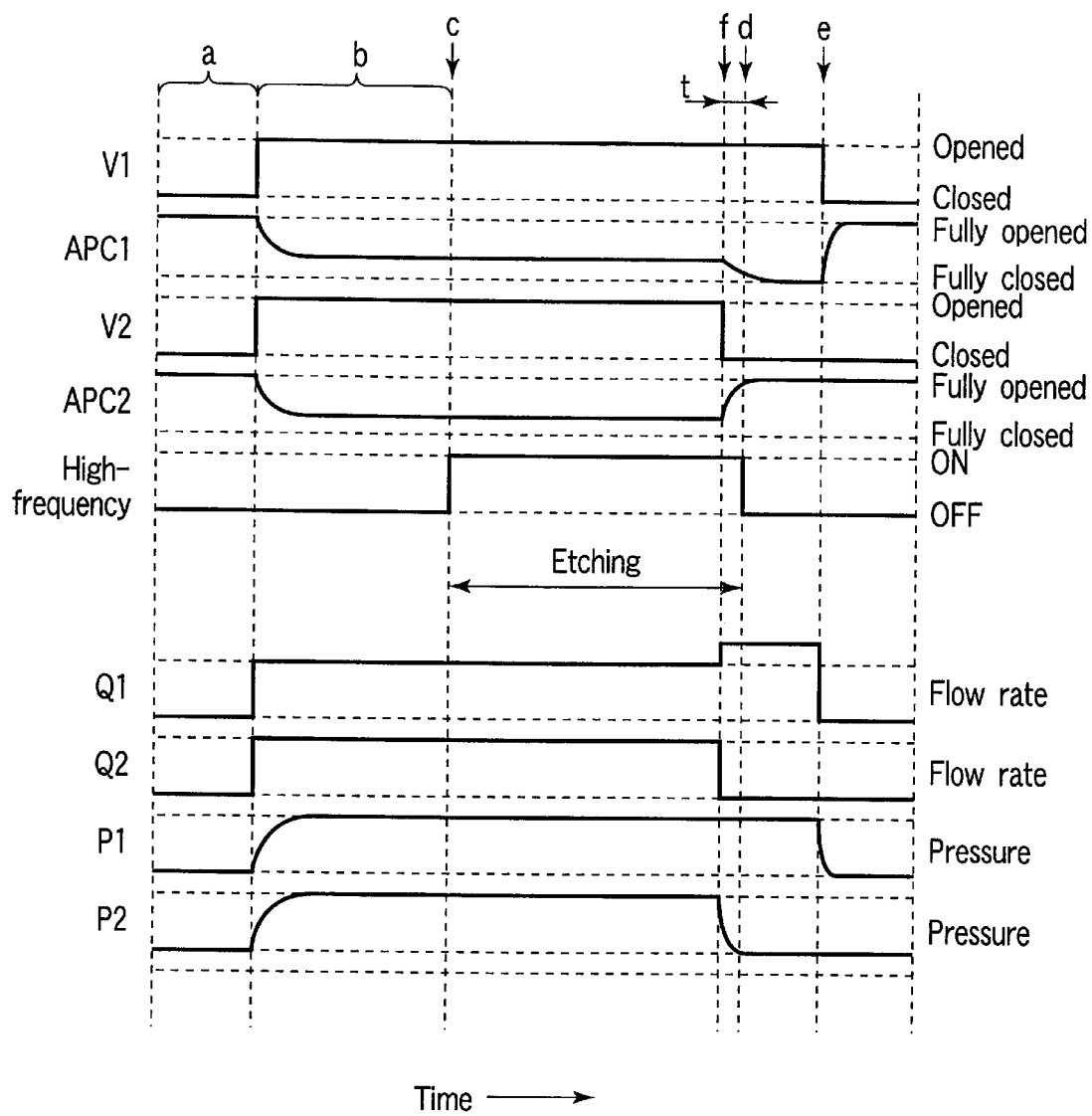
F I G. 17

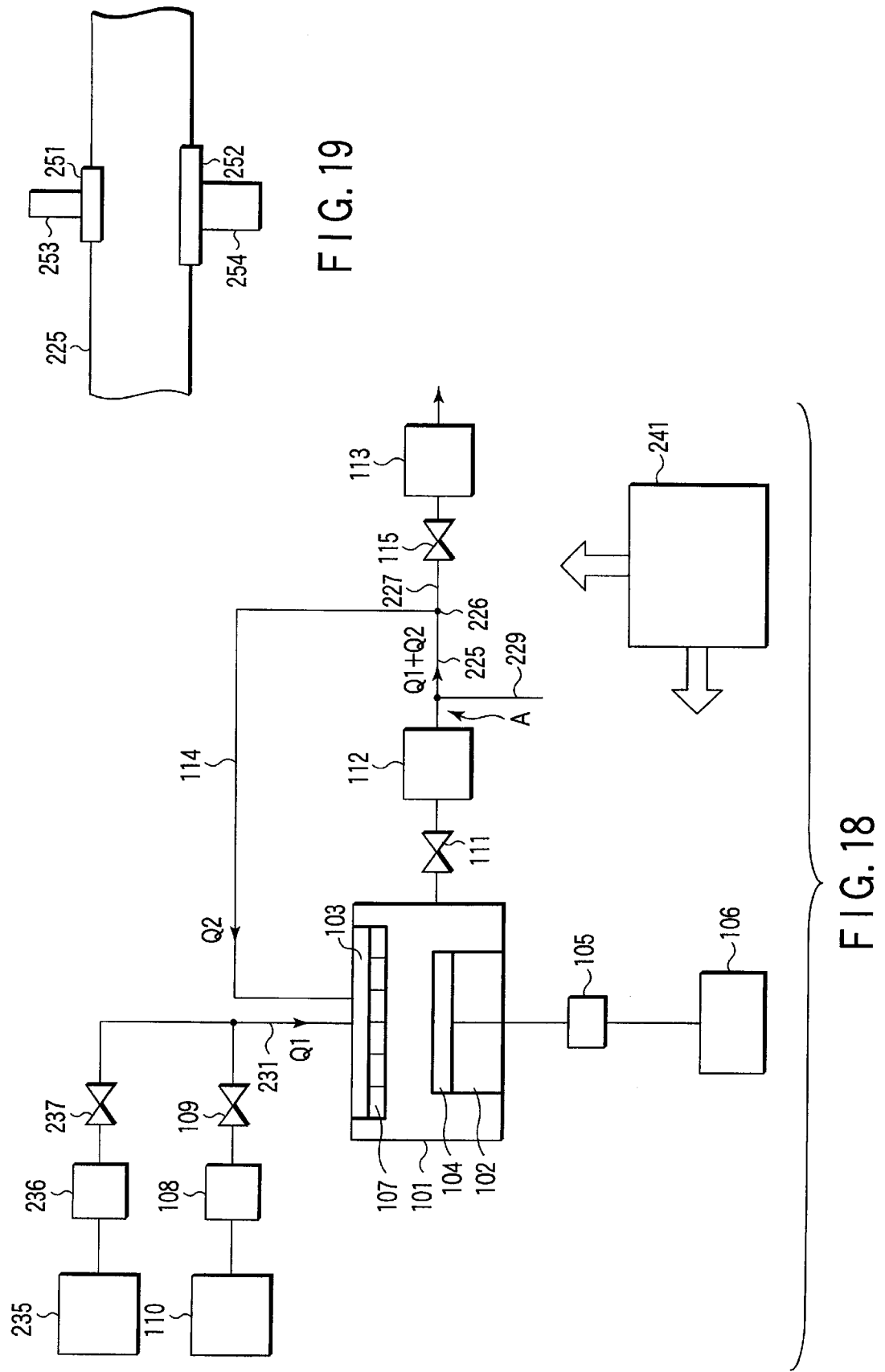

METHOD FOR MANUFACTURING A SEMICONDUCTOR DEVICE USING RECIRCULATION OF A PROCESS GAS

CROSS-REFERENCE TO RELATED APPLICATIONS

This application is based upon and claims the benefit of priority from the prior Japanese Patent Applications No. 2000-287716, filed Sep. 21, 2000; and No. 2001-012257, filed Jan. 19, 2001, the entire contents of both of which are incorporated herein by reference.

BACKGROUND OF THE INVENTION

1. Field of the Invention

This invention relates to a semiconductor processing apparatus and to a method of manufacturing the semiconductor device, and in particular, to a semiconductor processing apparatus and to a method of manufacturing the semiconductor device, wherein a process gas is introduced into a vacuum chamber for treating a substrate to be processed (hereinafter referred to as a substrate).

2. Description of the Related Art

The treatment of a substrate has been conducted according to the following procedures in a semiconductor processing apparatus, specifically a plasma etching apparatus or a plasma CVD apparatus, which is designed to generate plasma for decomposing a process gas employed for treating the substrate.

First of all, a process gas is introduced into a process chamber of a vacuum state. Then, by the application of high-frequency, a plasma is caused to generate in the process chamber, thereby decomposing and exciting the process gas. As a result, the substrate is treated by the highly reactive active species thus generated. It should be noted however that not all of the process gas that has been introduced into the vacuum process chamber is consumed by the reaction thereof with the substrate in the semiconductor processing apparatus. Rather, most of the process gas that has been introduced into the vacuum process chamber is not utilized but permitted to go out of the system by a vacuum pump.

Under the circumstances, it is urgently desired to improve the utilization efficiency of the process gas so as to reduce the cost for the process gas in the manufacturing cost involved in this etching or CVD process.

Meanwhile, various kinds of PFC (Perfluoro Carbon) gas having a high GWP (Global Warming Potential) are now used in large amounts as the process gas or as the cleaning gas of the apparatus in the etching process or CVD process. It is urgently imposed on the manufacturers of semiconductor device to take measures to reduce the quantity of the PFC gas to be released into air atmosphere for the purpose of suppressing the warming of the earth. As a matter of fact however, it has been considered very difficult at this moment to find out an alternate gas which is low in GWP, excellent in safety, and moreover, capable of exhibiting a desirable performance which is at least comparable to that of the PFC gas. Under the circumstances, it is very important subject matter at present to enhance the utilization efficiency of the process gas which is available now, thereby reducing the quantity of the process gas to be used.

With a view to overcome this problem, an apparatus as explained below has been proposed (Japanese Patent Unexamined Publication (Kokai) No. H9-251981). According to this prior art, a plasma etching apparatus or a plasma CVD apparatus which is designed to treat a substrate in a vacuum process chamber is constructed such that a circulation piping is provided between a exhaust side piping and the process chamber so as to allow a portion of exhausted gas to return into the process chamber, thereby making it possible to re-use the gas.

Since the process gas that has been once exhausted is recycled back to the process chamber according to this system, it would be possible to enhance the utilization efficiency of process gas and hence to save the quantity of process gas, resulting in that the quantity of PFC gas to be discharged into the atmosphere can be greatly reduced. However, this system is accompanied with several problems if it is to be actually applied to the plasma processing step in the actual production site as explained below.

One of the problems is the accumulation of deposit inside the circulation piping in a long-term running. Not only in the plasma CVD process, but also in the etching process where high-selectivity characteristics such as highly selective etching of oxide film is necessitated, a process gas to be circulated is more likely formulated so as to contain a large amount of reactive components which can be very easily adhered onto the surface of solid matter. In this case, it is assumed that most of the reactive components will adhere onto the inner wall of the process chamber, but the reactive components is allowed to adhere partially on the inner wall of the circulation piping as the process gas passes through the circulation piping. If the deposit that has been adhered onto the inner wall of the circulation piping is peeled off and allowed to flow as dust into the process chamber, the deposit may adhere onto a wafer, thus possibly deteriorating the yield of the device being treated. Therefore, according to the current practice, it is considered inevitable, for the purpose of preventing the peeled deposit from flowing as dust into the process chamber, to entirely exchange the circulation piping with a fresh one every predetermined period. It is also proposed to provide a filter in the circulation piping. However, since the provision of ordinary filter would lead to the deterioration of conductance due to the clogging of the filter, the proposal is not necessarily appropriate.

The other problem is related to the method of controlling the flow rate of circulating gas. Namely, according to the aforementioned system, the opening degree of valve for controlling the flow rate of circulating gas is required to be checked every time depending on the process conditions, which is rather troublesome.

BRIEF SUMMARY OF THE INVENTION

A semiconductor processing apparatus according to one embodiment of the present invention comprises:
a process chamber treating a substrate;
a process gas feeder feeding a process gas to the process chamber;
a first vacuum pump exhausting the process chamber;
a second vacuum pump inhaling gas on an exhaust side of the first vacuum pump; and
a circulation path circulating at least a part of the process gas exhausted from the process chamber via the first vacuum pump into the process chamber;
wherein the circulation path is provided with a dust trapping mechanism, the dust trapping mechanism being capable of substantially maintaining a conductance of the circulation path before and after the capture of dust.

A method of manufacturing a semiconductor device according to one embodiment of the present invention comprises:

exhausting a process chamber;

feeding a process gas to the exhausted process chamber;

applying a high-frequency power to the process gas to generate a plasma to treat a substrate;

exhausting the process gas from the process chamber;

circulating at least part of the process gas that has been exhausted from the process chamber to the process chamber;

suspending the circulation of the process gas to the process chamber; and stopping the application of the high-frequency power subsequent to the suspension of the circulation of the process gas.

A method of manufacturing a semiconductor device according to another embodiment of the present invention comprises:

exhausting a process chamber;

feeding a process gas to the exhausted process chamber;

applying a high-frequency power to the process gas to generate a plasma for treating a substrate;

exhausting the process gas from the process chamber;

circulating at least part of the process gas that has been exhausted from the process chamber, to the process chamber via a circulation path, a deposit from the process gas being allowed to deposit inside a passage of the exhausted process gas;

accumulating the time taken to treat the substrate while circulating the process gas; and circulating an active gas as the time accumulated reaches a provided period, to allow the active gas to react with the deposit formed inside the passage of the exhausted process gas to remove the deposit.

A method of manufacturing a semiconductor device according to another embodiment of the present invention comprises:

exhausting a process chamber;

feeding a process gas to the exhausted process chamber;

applying a high-frequency power to the process gas to generate a plasma for treating a substrate;

exhausting the process gas from the process chamber;

circulating at least part of the process gas that has been exhausted from the process chamber, to the process chamber via a circulation path, a deposit from the process gas being allowed to deposit inside a passage of the exhausted process gas;

monitoring a thickness of the deposit thus deposited; and circulating an active gas as being monitored that the thickness of the deposit reaches a provided thickness to allow the active gas to react with the deposit deposited inside the passage of the exhausted process gas to remove the deposit.

BRIEF DESCRIPTION OF THE SEVERAL VIEWS OF THE DRAWING

FIG. 17 is a diagram illustrating one example of a sequence of etching treatment shown in Example 5;

FIG. 18 is a schematical view illustrating the semiconductor processing apparatus employed in Example 6; and FIG. 19 is a schematical view illustrating one example of monitoring the film thickness of deposited film by an optical means in the semiconductor processing apparatus shown in FIG. 18.

DETAILED DESCRIPTION OF THE INVENTION

First of all, there will be explained one example where a silicon oxide film was etched using a DRM type plasma etching apparatus equipped with a circulating mechanism while circulating a gas.

Figure 1:
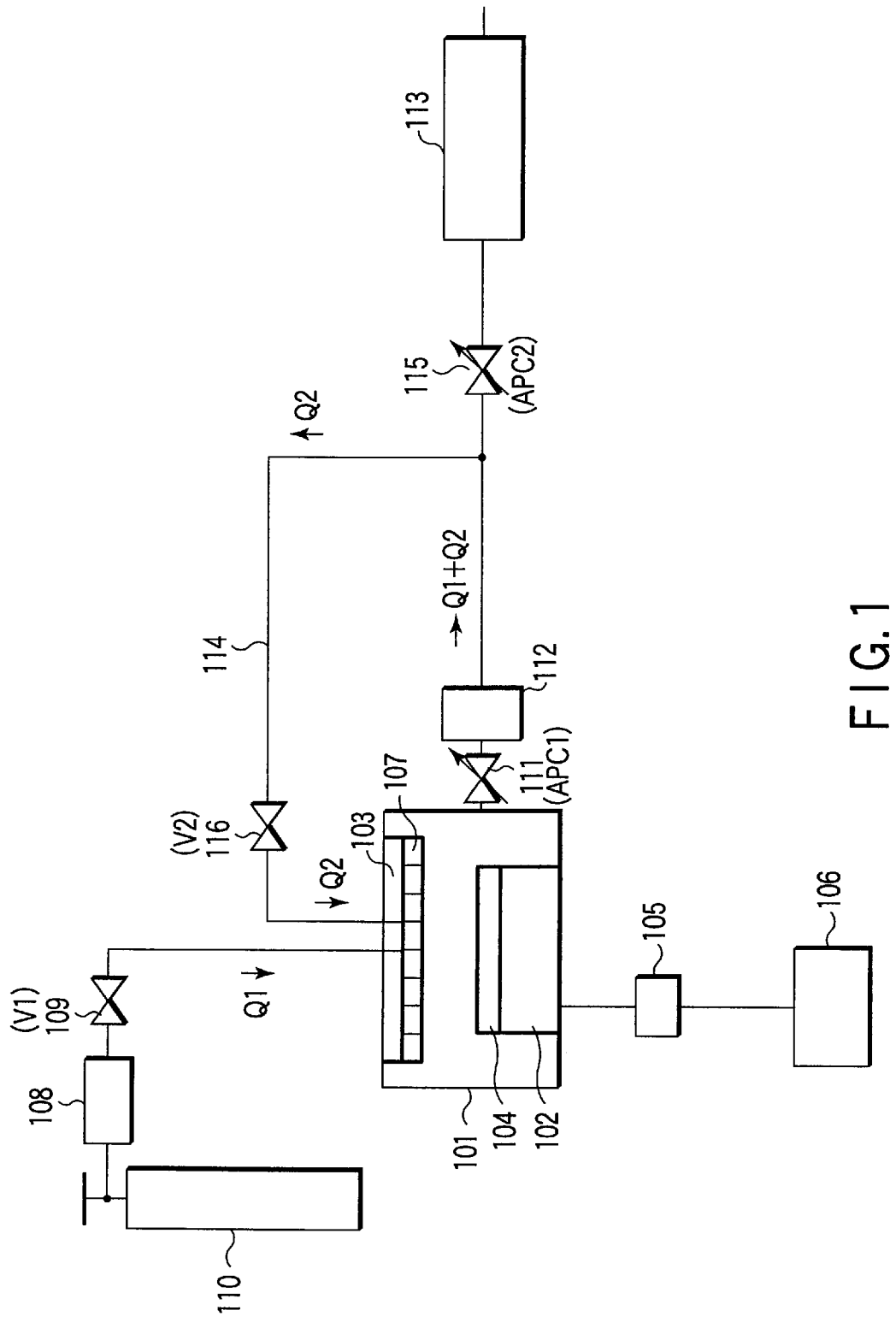
FIG. 1 is a schematical view illustrating a DRM (Dipole-Ring Magnet) type plasma etching apparatus.

The schematical structure of the apparatus employed in this case is shown in FIG. 1. As shown in FIG. 1, a parallel plate type plasma generating mechanism having a cathode electrode 102 and an anode electrode 103 facing each other is disposed inside a chamber (process chamber) 101 so as to enable a magnetic field to be generated in the process chamber by a magnetic field applying apparatus (not shown). This chamber 101 is constructed such that a substrate 104 can be placed on the cathode electrode 102, and that this cathode electrode 102 is connected via a matching circuit 105 with a high-frequency power source 106.

On the other hand, a shower nozzle 107 for uniformly feeding a process gas to the substrate 104 is incorporated in the anode electrode 103. This shower nozzle 107 is connected via at least one flow rate controller 108 and an on-off valve 109(V1) with a gas cylinder 110 which is employed as a process gas source. The apparatus shown herein includes one flow rate controller 108 and one gas cylinder 110. However, the number of flow rate controller 108 and of the gas cylinder 110 can be optionally determined as required.

The process chamber 101 is connected via an automatic pressure control valve 111 (APC1) with a turbo molecular pump 112, and the exhaust side of the turbo molecular pump 112 is further connected with a dry pump 113. A circulation piping 114 is disposed so as to connect the exhaust side of the turbo molecular pump 112 with the process chamber 101. Further, another on-off valve 116 (V2) is mounted on the circulation piping 114, and another automatic pressure control valve 115 (APC2) is disposed upstream of the dry pump 113 for controlling the gas circulating rate. A circulation path includes the circulation piping 114 and the on-off valve 116. At least a part of the process gas exhausted from the process chamber 101 via the turbo molecular pump 112 is circulated via the circulation path into the process chamber 101.

On the occasion of treating the substrate by the apparatus shown herein, $C_4F_8$, CO, Ar and $O_2$ gases are fed at a desired ratio from the gas cylinder 110 to the process chamber 101 through the flow rate controller 108. The flow rate of gas to be introduced into the process chamber 101 is shown herein as Q1. At the same time, the on-off valve 116 mounted on the circulation piping 114 is opened, and the opening degree of the automatic pressure control valve 115 disposed upstream of the dry pump 113 is restricted. A portion of the exhaust gas from the process chamber 101 through the operation of the turbo molecular pump 112 is allowed to return into the process chamber through the circulation piping 114. The flow rate of exhaust gas to be returned back to the process chamber 101 is shown herein as Q2. Since the process gas that has been exhausted is re-used, the quantity Q1 of fresh gas to be introduced into the process chamber 101 can be reduced proportionately as compared with the case where the exhaust gas is not circulated.

Figure 2:
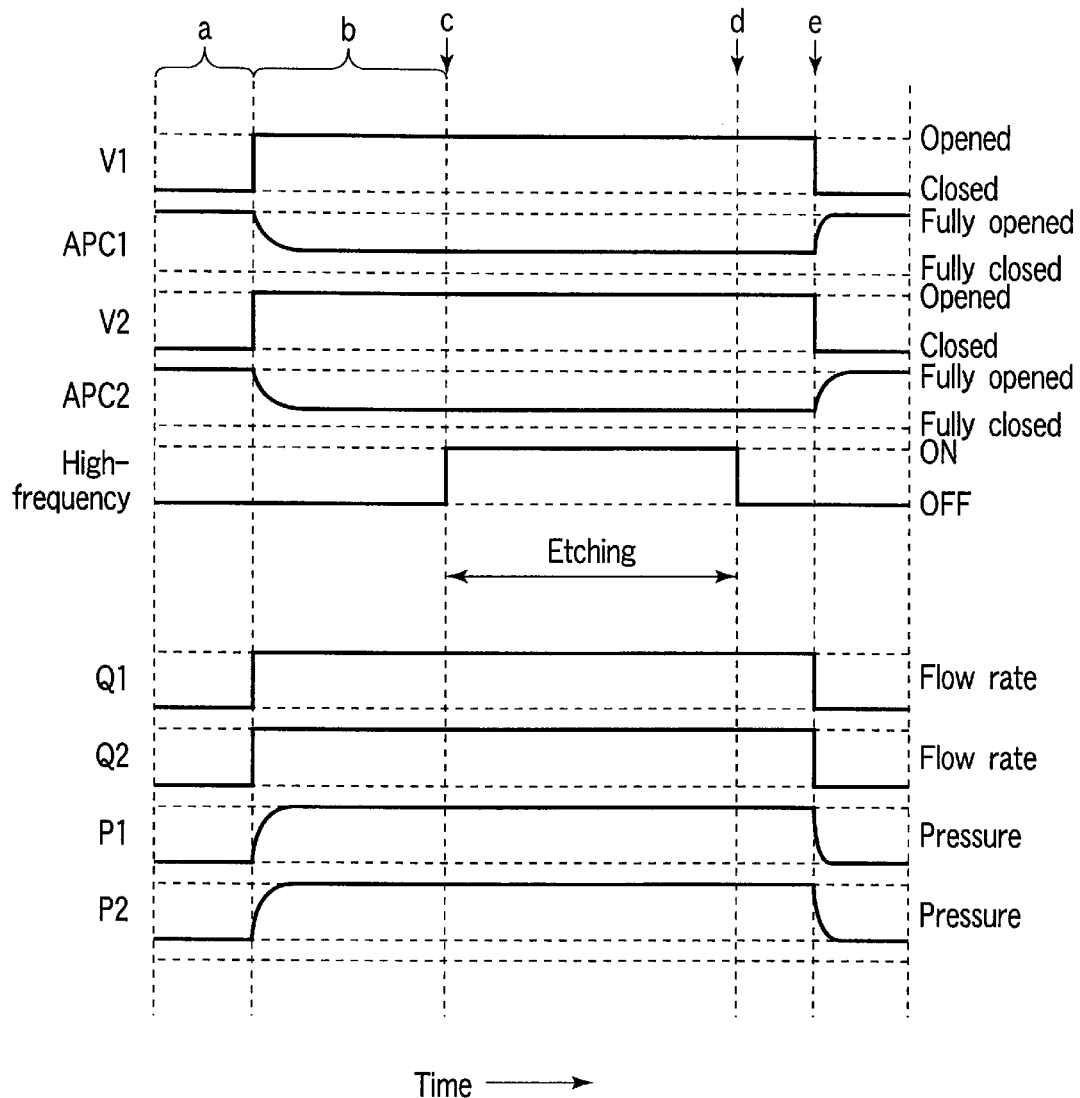
FIG. 2 is a diagram illustrating a sequence of treatment according to the method in a DRM (Dipole-Ring Magnet) type plasma etching apparatus.

The process mentioned above is performed according to the sequence as shown in FIG. 2. During the idling (shown as "a" in FIG. 2) between treatments, the on-off valves V1 and V2 are closed, while the APC1 and APC2 are fully opened. By doing this, the pressure P1 inside the process chamber 101 and the pressure P2 inside the circulation piping 114 reaches base pressure.

Then, in the step of gas introduction/pressure adjustment (shown as "b" in FIG. 2), the V1 is opened to feed $C_4F_8$, CO, Ar and $O_2$ gases at a desired ratio from the gas cylinder 110 to the process chamber 101 through the flow rate controller 108, and at the same time, the pressure P1 in the process chamber 101 is controlled to the specified value by the automatic pressure control valve 111 (APC1). Concurrently, the opening degree of the automatic pressure control valve 115 (APC2) is adjusted so as to allow a predetermined ratio (for example, 80%) of the exhaust gas exhausted from the process chamber 101 by the turbo molecular pump 112 is permitted to return into the process chamber through the circulation piping 114. When these pressures P1 and P2 are stabilized, a high-frequency power is applied to the process chamber 101 (shown as "c" in FIG. 2), thereby initiating the etching process.

After a predetermined period of treatment, the high-frequency power is stopped (shown as "d" in FIG. 2), the valves V1 and V2 are closed, and the APC1 and APC2 are fully opened (shown as "e" in FIG. 2). In this manner, the gas inside the process chamber 101 and the circulation piping 114 is completely exhausted therefrom.

According to this method, the flow rate of circulating gas is controlled as follows. First of all, the on-off valve 116 (V2) is closed, and the automatic pressure control valve 115 (APC2) is brought into a fully opened state. Namely, the automatic pressure control valve 111 (APC1) is adjusted in such a manner that the pressure inside the process chamber 101 can be maintained at a prescribed pressure as the inlet gas flow rate is set to Q1=100 sccm under the condition wherein the gas is not circulated to the process chamber 101. The opening degree of the valve APC1 at this moment is defined as 100. When 1 kW of high-frequency power is applied to the process chamber 101, the process gas is decomposed, and therefore, the valve APC1 is opened further in order to keep the pressure inside the process chamber 101 at a constant pressure, thus rendering the opening degree of the valve APC1 to 110. Thereafter, while keeping the opening degree of the valve APC1 to 110, the inlet gas flow rate is controlled to 20% of the initial flow rate. Namely, the inlet gas flow rate is set to 20 sccm, and the valve V2 is opened and at the same time, the valve APC2 is restricted to increase the circulating flow rate until the pressure inside the process chamber 101 is recovered to a prescribed pressure. The opening degree of valve APC2 on this occasion is set equivalent to that where the circulation ratio is 80%, the opening degree being memorized in a recipe.

The opening degree of valve APC2 is confirmed for each process condition, i.e. every time the flow rate of inlet gas, the pressure or the high-frequency power is changed. On the occasion of actual processing, the opening degree of valve APC2 is set in advance according to the recipe. It has been found possible to reproduce 80% gas circulating ratio by setting the opening degree of valve APC2 to the confirmed value, which is designed to return 80% of the exhausted gas to the process chamber 101 when Q1 is introduced and valve V2 is opened.

EXAMPLE 1

This example explains one example where the recipe for SAC (Self-Aligned Contact) that has been used in the conventional apparatus equipped with no circulating mechanism is applied to the etching of a silicon oxide film by a DRM type plasma etching apparatus equipped with a circulating mechanism while circulating the process gas. Namely, the circulating ratio was changed in this example.

Figure 3:
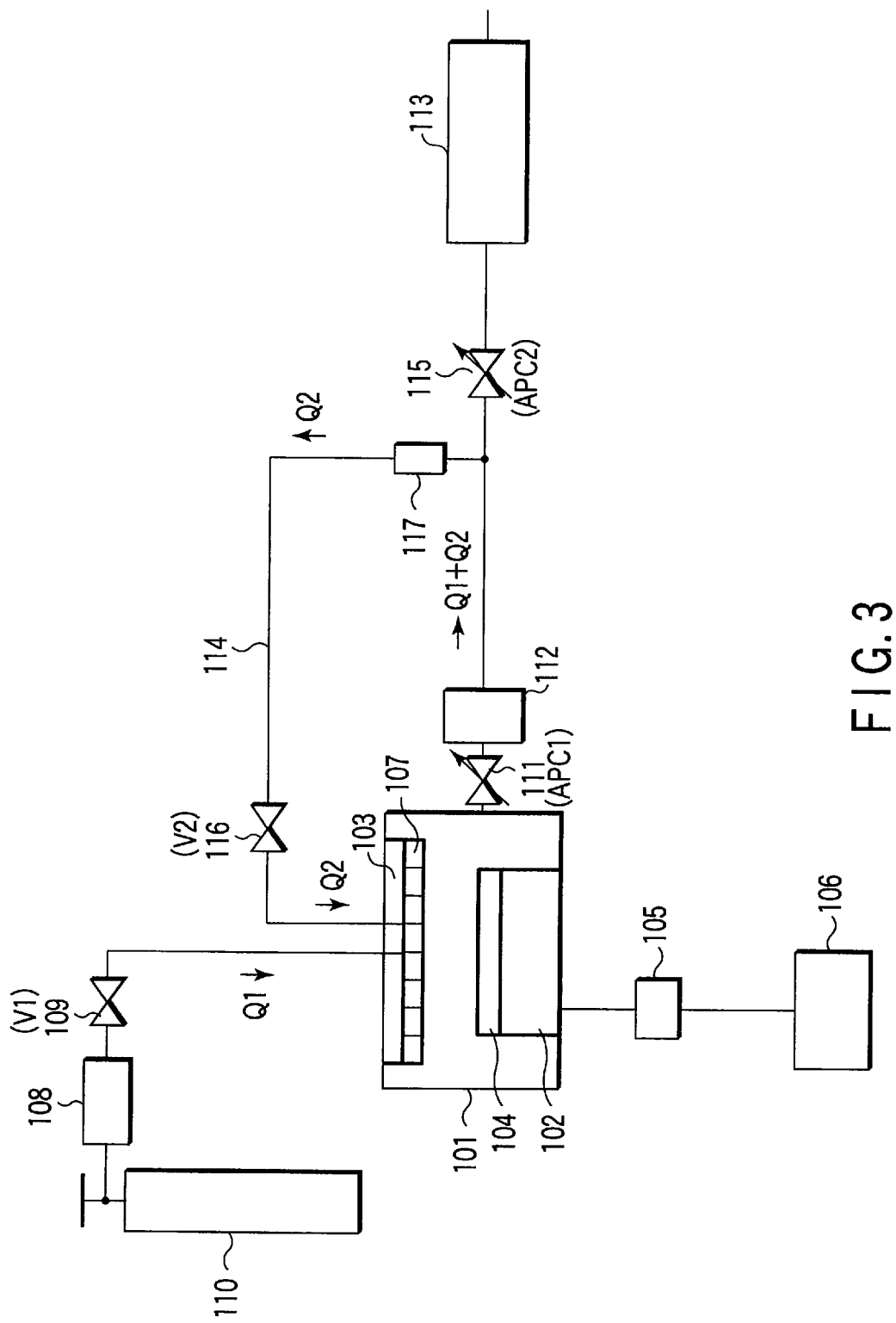
FIG. 3 is a schematical view illustrating one example of the semiconductor processing apparatus according to one embodiment of the present invention.

FIG. 3 schematically shows the construction of the plasma etching apparatus employed in this example. The portions or components which are the same as those of FIG. 1 are identified by the same reference numerals, thereby omitting the illustration thereof. Referring to FIG. 3, a dust trapping mechanism 117 is disposed on a circulation piping 114 close to a branched portion. This dust trapping mechanism 117 is designed to capture reaction products exhibiting a high adhesivity and included in a circulating gas so as to substantially maintain a conductance of the circulation piping 114 before and after the capture of dust. By the expression of "substantially maintain a conductance", it means that the deterioration of conductance of circulation piping 114 after the capture of dust is confined to not more than about 5%. Incidentally, when dust is captured using a filter, it would be difficult to confine the deterioration of conductance to not more than about 5% due to the clogging of the filter.

Figure 4:
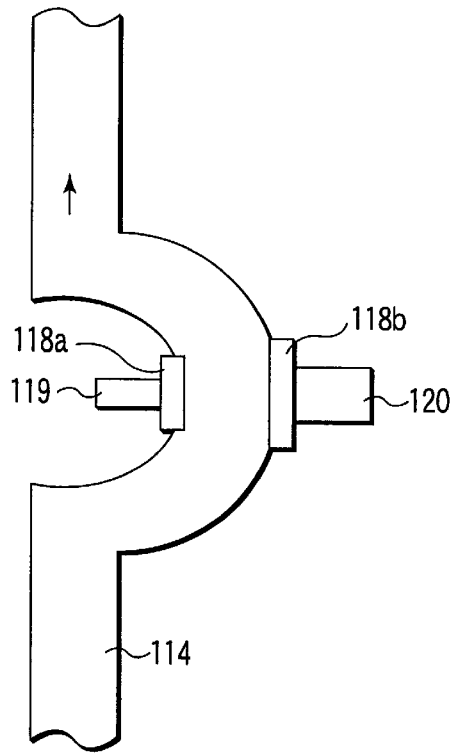
FIG. 4 is a schematical view illustrating one example of a dust trapping mechanism.

As for the dust trapping mechanism 117, any mechanism which is detachable and capable of converting the direction of gas flow passing therein by an angle of 180 degrees or more can be employed. FIG. 4 shows one structural example of the dust trapping mechanism 117. The circulation piping 114 is detachably provided with a U-shaped portion functioning as the dust trapping mechanism 117. As shown in FIG. 4, a couple of glass windows 118a and 118b facing each other are provided at the U-shaped curved portion. A light source 119 is attached to one of these glass windows, and a photo-receptor 120 is attached to the other.

The effects of the dust trapping mechanism 117 according to this example were investigated as follows. First of all, by an etching apparatus provided with no dust trapping mechanism 117, the etching of an oxide film on a semiconductor substrate was performed while circulating a process gas. As a result, a thin deposit of reaction product which could be visually recognized was admitted on an entire inner wall of the circulation piping 114 after six months of running. Although the generation of dust was not recognized in the process chamber 101 at this moment, this circulation piping 114 was entirely exchanged with a fresh one in a preventive viewpoint.

On the other hand, in the case of the etching apparatus provided with the dust trapping mechanism 117 of this example, only the dust trapping mechanism portion was exchanged with a cleansed spare parts at the moment when the intensity of the light source 119 detected by the photo-receptor 120 was attenuated down below a standard value. The intensity of light was caused to deteriorate due to the deposit adhered onto the glass windows 118a and 118b attached to the curved portion. Although the degree of this deterioration was caused to alter depending on the operation rate or using condition of the apparatus, only the dust trapping mechanism 117 portion was exchanged with a cleansed spare parts every other month in this example. As a result, even after two years, deposit was not recognized on other portions of the circulation piping 114, and therefore, they were not required to be exchanged with new ones.

The dust trapping mechanism 117 is not confined to that illustrated in FIG. 4. Thus, any mechanism which is detachable and capable of converting the direction of gas flow passing therein by an angle of 180 degrees or more can be employed. For example, the dust trapping mechanism 117 may be combined with a pipe direction altering member (such as an elbow) or may be of a plurally bent configuration. Further, the dust trapping mechanism may be of a U-shaped configuration having an angled portion, or of a spiral configuration.

Figure 5A:
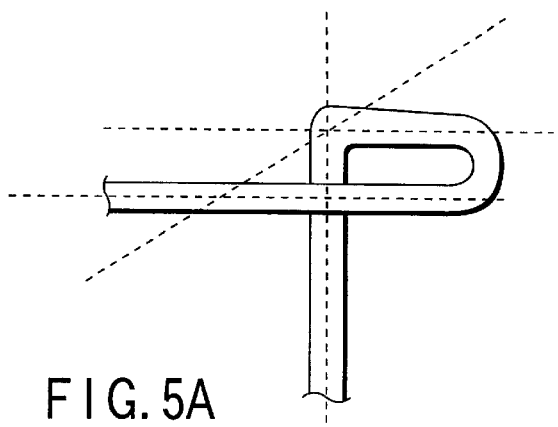
FIGS. 5A to 5C are schematical views illustrating other examples of dust trapping mechanism.
Figure 5B:
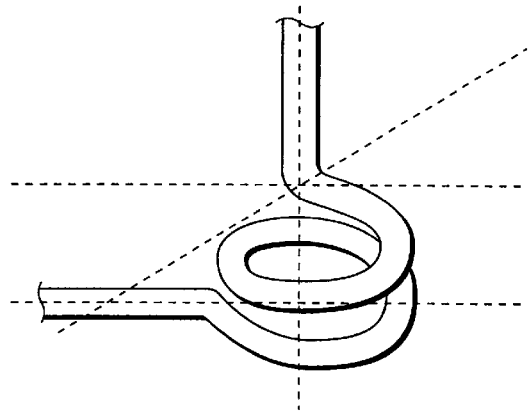
Figure 5C:
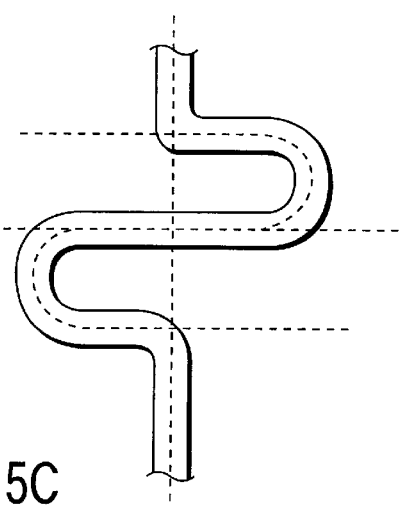
Figure 6A:
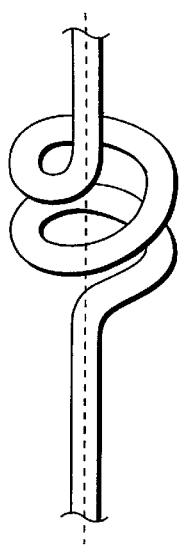
FIGS. 6A to 6C are schematical views illustrating other examples of dust trapping mechanism.
Figure 6B:
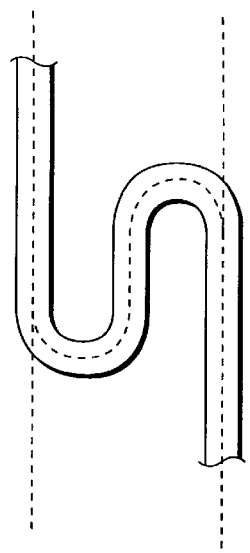
Figure 6C:
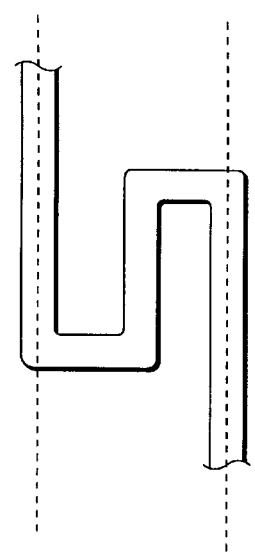

FIGS. 5A to 5C and FIGS. 6A to 6C show other examples of the dust trapping mechanism 117. Namely, FIG. 5A shows a dust trapping mechanism formed of a combination of a U-shaped portion and an angled portion; FIG. 5B shows a dust trapping mechanism formed of a combination of a spiral portion and an angled portion; and FIG. 5C shows a dust trapping mechanism formed of a combination of a U-shaped portion and a linear portion. Further, FIG. 6A shows a dust trapping mechanism formed of a combination of a spiral portion and a linear portion; FIG. 6B shows a dust trapping mechanism formed of a combination of a U-shaped portion and a location altering portion; and FIG. 6C shows a dust trapping mechanism formed of U-shaped portions each having an angled portion.

Another configuration of the dust trapping mechanism 117 may consist of a combination of a portion of the circulation piping 114 aforementioned with an obstruction within the piping, such as a strut or struts whose areas would be small enough not deteriorate the conductance of the circulation piping, but would change the local direction of the gas flow and collect dust. The area of the obstruction should be kept less than 5% of the cross-sectional area of the piping to avoid degradation of conductance.

It has been found that even when any of the aforementioned dust trapping mechanisms are employed, it is possible to confine the deterioration of conductance of circulation piping after the capture of dust to not more than about 5%.

The specific configuration of the dust trapping mechanism 117 can be suitably selected depending on the conditions such as piping space, cleaning frequency and conductance required. However, if it is desired to re-use the dust trapping mechanism 117, a dust trapping mechanism having a curved configuration but no angled portion is preferable in terms of easiness of cleaning.

Further, when a portion of the circulation piping 114 is kept at a lower temperature than that of other portions thereof, it can be functioned as the dust trapping mechanism 117. Namely, a component which adheres onto the inner wall of piping and may become a source for dust would be concentratedly captured by this dust trapping mechanism 117 of which temperature is set lower than that of other regions of the circulation path. In this case, the temperature of the dust trapping mechanism 117 is set to such that a gas component of high vapor pressure which contributes to the etching is not allowed to adsorb thereon. Specifically, the temperature of the dust trapping mechanism 117 is higher than the temperature wherein a vapor pressure of the etching gas equivalent to the pressure of the dust trapping mechanism 117.

Figure 7:
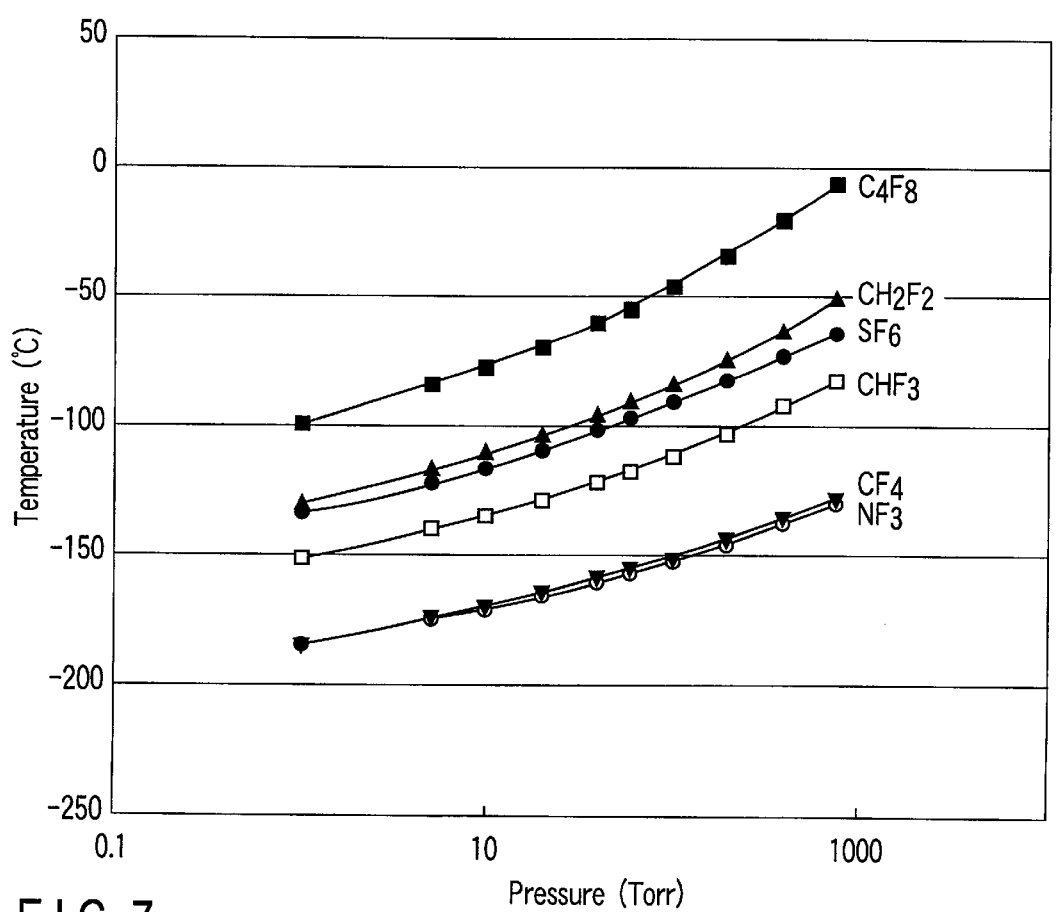
FIG. 7 is a graph illustrating vapor pressure curves of various etching gases.

The graph shown in FIG. 7 illustrates the vapor pressure curves of various etching gases. Next, the suitable temperature of the dust trapping mechanism 117 will be specifically explained with reference to this graph. Since the operating pressure inside the circulation piping 114 is generally set to the range of 1 to 10 Torr, when $C_4F_8$ gas is used as an etching gas, it is required, in order to prevent this $C_4F_8$ gas from being adsorbed onto the dust trapping mechanism 117, to set the temperature of the dust trapping mechanism 117 to about −75° C. or more. The lower limit of the cooling temperature of the dust trapping mechanism 117 is determined depending on a kind of an etching gas used. On the other hand, $CF_2$ which may become a source for dust is considered impossible to adsorb onto the dust trapping mechanism 117 at a temperature more than 150° C. Therefore, if it is desired to permit $CF_2$ to adsorb onto the dust trapping mechanism 117, the temperature of the dust trapping mechanism 117 should not exceed 150° C. Further, if it is desired to permit a gas containing silicon and fluorine such as $SiF_4$ to adsorb onto the dust trapping mechanism 117, the temperature of the dust trapping mechanism 117 is required to be kept at a temperature of not higher than −150° C. If a large quantity of silicon-based gas is allowed to exhaust and circulate, it will lead to the generation of dust inside the process chamber due to the plasmic decomposition of the gas.

Incidentally, the lower the temperature of the dust trapping mechanism 117 is, the higher the capturing efficiency of dust becomes, thereby making the dust trapping mechanism 117 more compact and effective. However, if the temperature of the dust trapping mechanism 117 is to be kept extremely low, the dust trapping mechanism is required to be constructed into a heat-insulating structure at a temperature lower than room temperature, thus making the dust trapping mechanism very complicated. Therefore, the temperature of the dust trapping mechanism 117 should be suitably selected taking these problems into consideration.

Figure 8A:
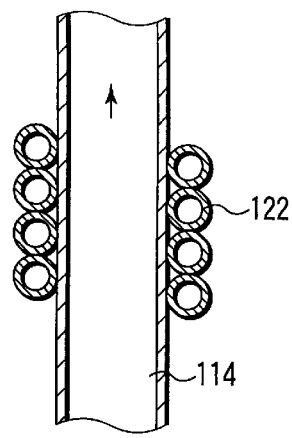
FIGS. 8A to 8C are schematical views illustrating other examples of dust trapping mechanism.
Figure 8B:
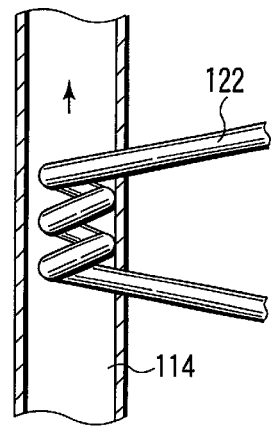
Figure 8C:
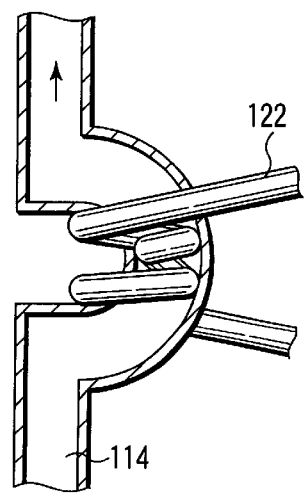

FIGS. 8A to 8C illustrate examples wherein a lower temperature portion is provided on the circulation piping 114, thereby making it function as the dust trapping mechanism 117. Specifically, a pipe for flowing a cooling water therethrough is attached to the outside or inside of the circulation piping 114, thereby providing the circulation piping 114 with a lower temperature portion. Namely, FIG. 8A shows a structure wherein a pipe 122 for flowing a cooling water cooled down to about 10° C. by chiller is attached to the piping 114; and FIG. 8B shows a structure wherein the similar pipe 122 as mentioned above is attached to the inside of the circulation piping 114. FIG. 8C shows a structure wherein the similar pipe 122 as mentioned above is provided in combination with the aforementioned U-shaped pipe.

It has been found that even when any of the aforementioned dust trapping mechanisms 117 are employed, it is possible to confine the deterioration of conductance of circulation piping 114 after the capture of dust to not more than about 5%.

In the case of the structure shown in FIG. 8B, since the cooled trapping mechanism 117 is disposed under a reduced pressure, only the coolant supply portion is required to be kept in a heat-insulating state. Therefore, the dust trapping mechanism 117 can be more easily kept at a temperature of −10° C. as compared with the structure shown in FIG. 8A, thereby making it possible to capture adsorbing components with high efficiency. Alternatively, a heater may be wound around the entire circulation piping 114 except the dust trapping mechanism 117, thereby making the dust trapping mechanism 117 lower in temperature as compared with the other portion of the piping 114. Furthermore, the circulation piping 114 may be constructed such that while cooling the dust trapping mechanism 117, the other portion of piping 114 is warmed.

Alternatively, an electrostatic dust collector may be disposed inside the circulation piping 114, thus utilizing it as a dust trapping mechanism 117.

Figure 9:
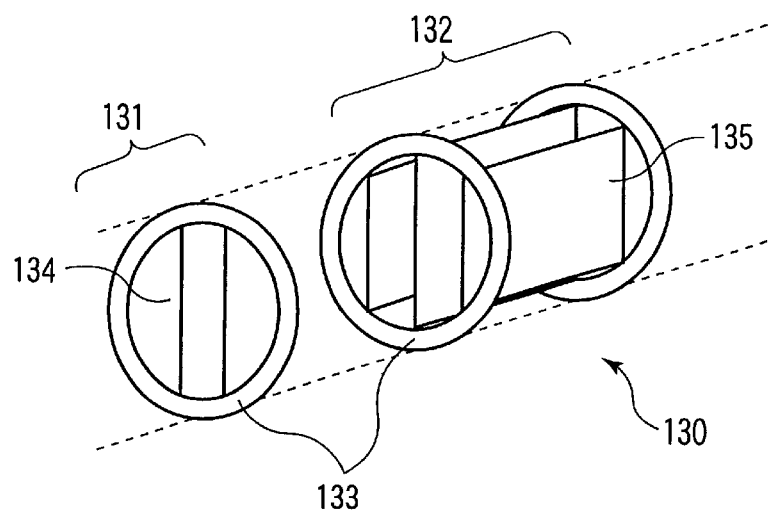
FIG. 9 is an exploded view illustrating the structure of an electrostatic dust collector.

Next, this electrostatic dust collector 130 will be explained in detail by referring to FIGS. 9 to 11. FIG. 9 is an exploded view illustrating the structure of the electrostatic dust collector 130. As shown in FIG. 9, the electrostatic dust collector 130 is provided on an upstream side thereof with an electrification portion 131 for negatively electrifying dust, and on a downstream side thereof with a trapping portion 132 for adsorbing the dust that has been negatively electrified. The electrification portion 131 is constituted by a fine linear electrode 134 which is secured to a frame 133 made of an insulating substance such as ceramic. The trapping portion 132 is constituted by a plate electrode 135 which is secured to a frame 133 made of an insulating substance such as ceramic.

Figure 10:
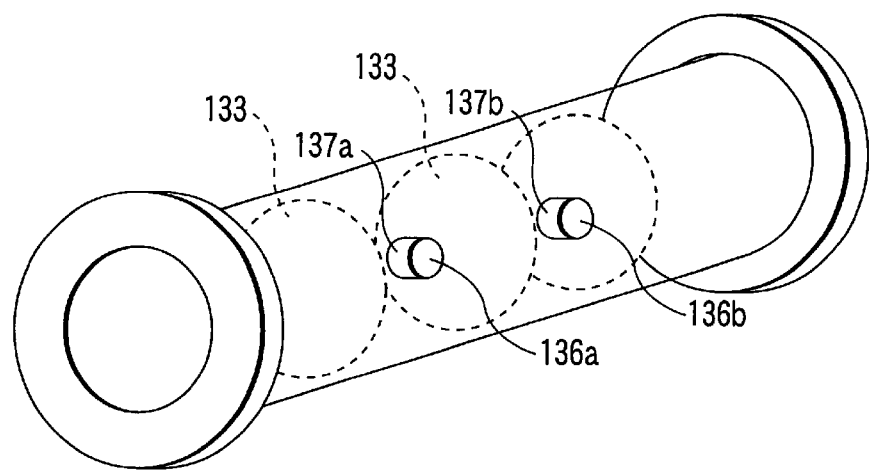
FIG. 10 is a schematical view illustrating a state of an electrostatic dust collector attached to the interior of a circulation piping.

As shown in FIG. 10, this electrostatic dust collector is mounted inside the circulation piping together with lead wires 136a and 136b for connecting the fine linear electrode 134 and the plate electrode 135 with a high voltage source (not shown) disposed outside the vacuum pipe, and also together with voltage introducing terminals 137a and 137b for connecting the electrodes with a high voltage source disposed outside the vacuum pipe.

Figure 11:
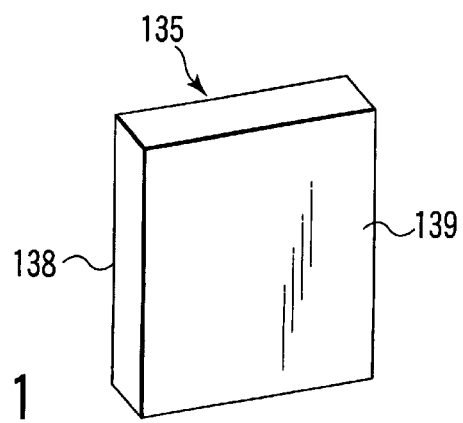
FIG. 11 is a schematical view illustrating a plate electrode to be employed in an electrostatic dust collector.

As shown in FIG. 11, the plate electrode 135 constituting the trapping portion 132 of the electrostatic dust collector is provided on the opposite surfaces of insulating plate thereof with electrodes, respectively, one of which being wired so as to constitute an earth electrode (kept at the same electric potential as that of the pipe) 138 and the other being wired so as to constitute a high voltage electrode 139.

The electrostatic dust collector 130 constructed in this manner can be mounted inside the circulation piping 114 of the semiconductor processing apparatus shown in FIG. 3 so as to perform the treatment of a substrate while circulating the process gas as explained below. For example, a voltage of −2 kV is applied to the fine linear electrode 134, and a voltage of 3.5 kV is applied to the high potential side of the plate electrode 135. As dust passes through the electrification portion 131 provided with the fine linear electrode 134, the dust is negatively electrified by a strong negative electric field and subsequently captured by the surface of high voltage electrode 139 of the trapping portion 132 disposed on the downstream side.

After finishing the treatment, the flow rate controlling valve 116 (V2) is closed to allow the gas inside the circulation piping 114 to be exhausted by the dry pump 113. On this occasion, when the electric potential of fine linear electrode 134 and the plate electrode 135 is returned back to 0V, the dust that has been adsorbed only by the effect of electrostatic force is allowed to be exhausted without passing through the process chamber 101. The deposit that is kept adsorbed on the electrode even after the lowering of electric potential can be removed by washing the plate electrode 135 by periodically dismounting the electrostatic dust collector 130.

As for the electrostatic dust collector 130, any kind of electrostatic dust collector can be employed as long as it is capable of electrifying and adsorbing dust components existing inside the circulation piping 114. For example, the electrification portion 131 may be constituted by a thermo-electron feeding mechanism employing a W filament. Alternatively, for the purpose of enhancing the electrification ratio of dust, the number of fine linear electrode 134 may be increased as required so long as a distance sufficient to prevent the generation of discharge can be retained. Further, for the purpose of enhancing the capturing ratio of dust, it may be also effective to elongate the length of the plate electrode 135 so as to increase the surface area thereof. Even when any of the aforementioned structures are employed, the conductance of circulation piping 114 can be substantially prevented from decreasing as long as the electrostatic dust collector 130 is constructed as described above. More specifically, since the deterioration of conductance can be confined to not more than about 5%, the performance of the gas circulating mechanism would not be substantially affected.

The dust trapping mechanism 117 constructed in any manner as described above should preferably be disposed close to a branched portion of the circulation piping 114 of the semiconductor processing apparatus shown in FIG. 3. When the dust trapping mechanism 117 is constructed in this manner, dust can be captured at the initial stage of the circulation of process gas. The dust trapping mechanism 117 may be disposed between the turbo molecular pump 112 and the branched portion. Even though it is possible to enhance the dust capturing capability by making the dust capturing mechanism larger, the conductance would be proportionally deteriorated. Therefore, it is advisable to determine the size of the dust trapping mechanism 117 by taking both of the dust capturing capability and the deterioration of conductance into consideration.

Even if any of the aforementioned trapping mechanisms is employed, the deposit can be monitored by visual observation or by optical means through a glass window installed on the dust trapping mechanism 117, thereby making it possible to effectively cleanse the dust trapping mechanism 117.

EXAMPLE 2

Figure 12:
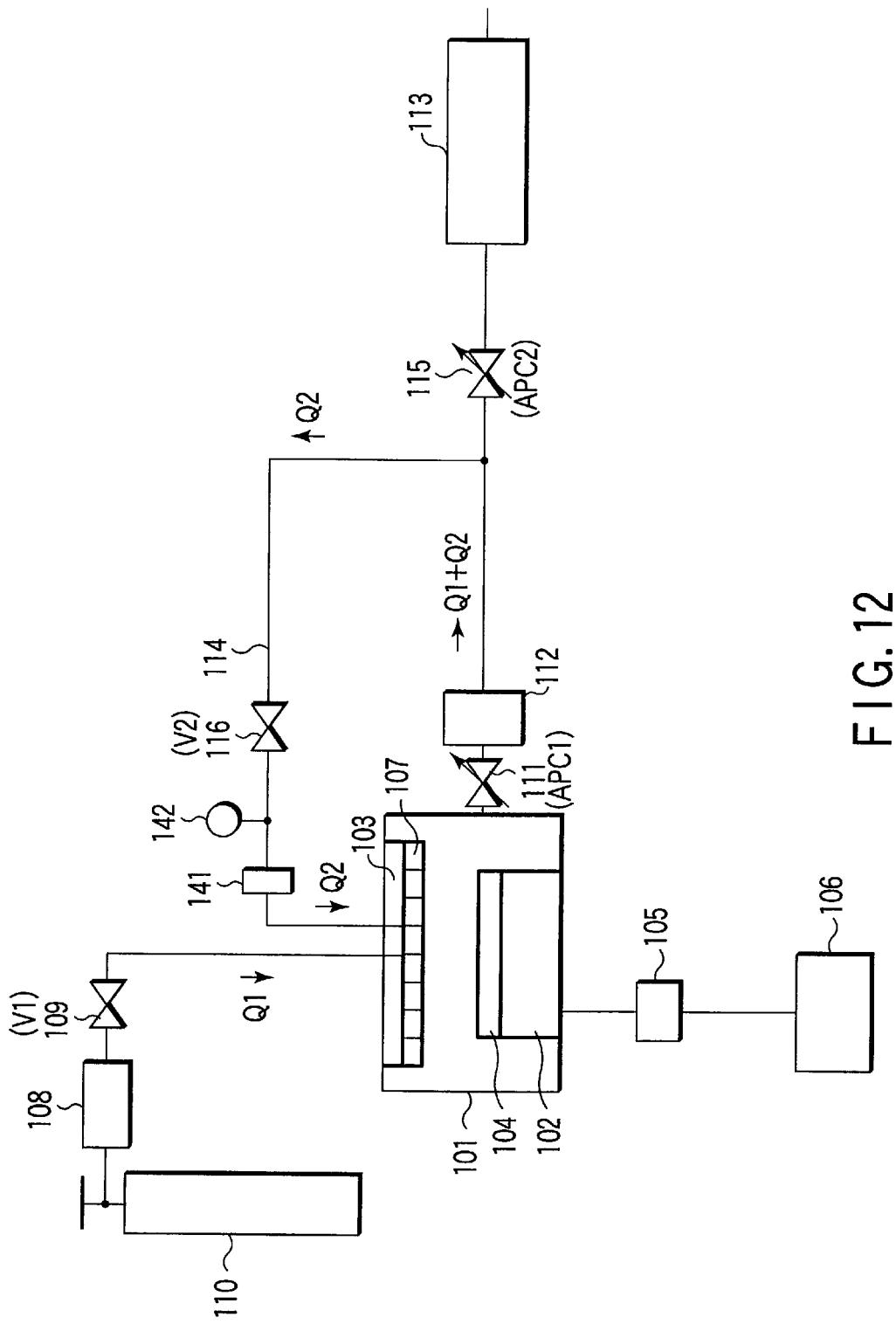
FIG. 12 is a schematical view illustrating an example of the semiconductor processing apparatus according to another embodiment of the present invention.

FIG. 12 shows a schematical structure of the semiconductor processing apparatus according to this example. Incidentally, the explanations on the portions or components which are common to those of FIG. 1 will be omitted herein.

In the apparatus shown in FIG. 12, the circulation piping 114 is provided with an orifice portion 141 and a manometer 142 which is designed to measure a pressure on the upstream side of the orifice. In this example, the circulation path comprises the circulation piping 114, the valve 116 (V2), the orifice portion 141 and the manometer 142. This orifice portion 141 is designed such that the pressures before and after the orifice portion 141 is always differentiated by at least three times under the running condition of the apparatus where a process gas is allowed to circulate.

Namely, the semiconductor processing apparatus of this example comprises a process chamber treating a substrate; a first vacuum pump exhausting the process chamber; a second vacuum pump inhaling gas on an exhaust side of the first vacuum pump; and a circulation path circulating at least a part of process gas exhausted from the process chamber via the first vacuum pump into the process chamber; wherein the circulation path is provided with an orifice portion and with a manometer measuring a pressure on the upstream side of the orifice; the orifice portion being capable of producing a pressure difference of at least three times under a running condition of the apparatus.

Although a critical pressure $r_c$ varies depending on the ratio of specific heat of gas, a gas to be employed ordinary can be made into a sound velocity flow if the pressure ratio is increased to three times or more. Therefore, if the kind of gas is the same, the flow rate of circulating gas at the orifice portion 141 would become proportional to the pressure upstream of the orifice.

Namely, the flow rate of circulating gas can be promptly detected from the result measured by the manometer 142, thereby enabling the flow rate of circulating gas to be easily controlled by the adjustment of the valve 116 (V2).

Using an apparatus equipped with the circulation piping 114 provided with the orifice portion 141 and the manometer 142 as mentioned above, the treatment of a substrate can be performed by the following procedures while circulating a process gas.

First of all, the similar conditions on gas to be employed in the processing apparatus (such as the conditions in CF-based gas/Ar gas, or in $N_2/O_2$ gas) are suitably grouped. Then, a proportional constant κ to be determined by the conditions on gas as defined by the following formula (1) is determined for each group.

$$Q2 = \kappa \times P2 \tag{1}$$

wherein Q2 is a flow rate of circulating gas; and P2 is a pressure on the upstream side of the orifice.

Figure 13:
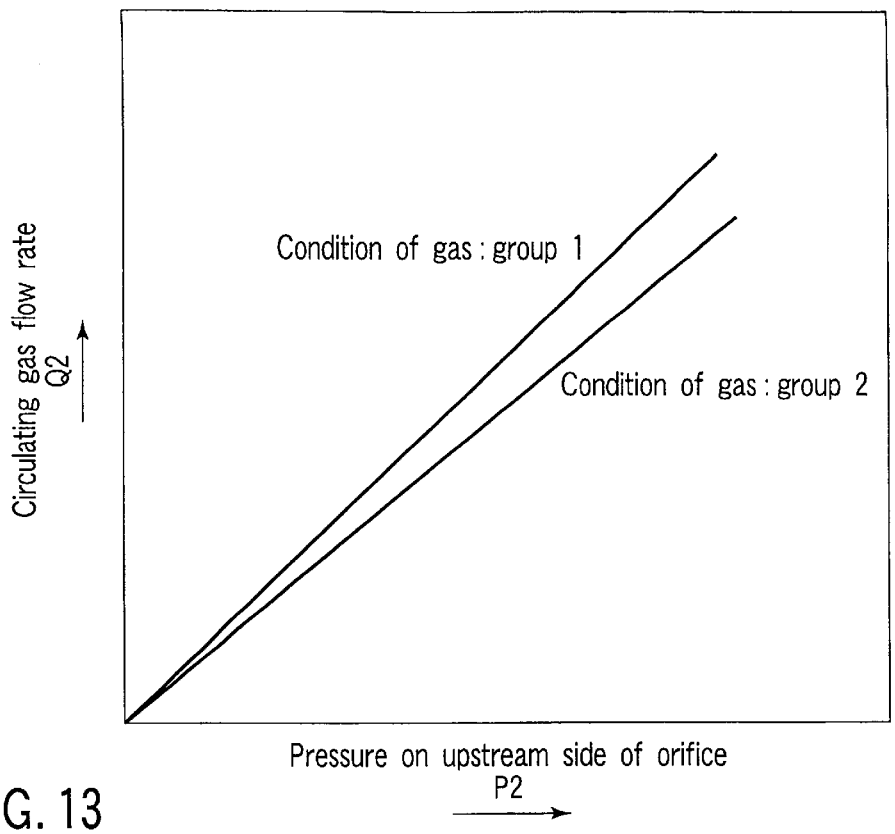
FIG. 13 is a graph illustrating a relationship between an upstream side pressure P2 of orifice portion and a circulating flow rate Q2.

More specifically, as shown in the graph of FIG. 13, the flow rate of circulating gas Q2 relative to the pressure P2 on the upstream side of the orifice is plotted for each grouped conditions on gas. Then, on the basis of the inclination of the plotted line, the proportional constant κ can be obtained.

Then, the adjustment of valve is conducted as follows for controlling the circulating gas so as to confine the gas circulation ratio to 80% in a process wherein the inlet gas flow rate Q1 is set to 100 sccm under the condition where the gas is not circulated. First of all, the flow rate of inlet gas is set to 20%, i.e. 20 sccm, and at the same time, the valve 116 (V2) is adjusted so as to control the pressure P2 on the upstream side of the orifice to P2=80(sccm)/κ.

On this occasion, the interior of the process chamber 101 is automatically adjusted to a desired pressure by the pressure control valve 111 (V1). When a high-frequency power is applied to the process chamber 101 to allow plasma to be discharged, the pressure inside the process chamber is increased due to the decomposition of gas, thereby enabling the opening degree of the pressure control valve 111 to be automatically changed so as to maintain a prescribed pressure. Although the pressure P2 on the upstream side of the orifice is caused to concurrently change on this occasion, the valve 116 (V2) is actuated so as to maintain P2=Q2/κ and to keep Q2 to 80 sccm.

Since the circulation piping 114 is provided with the predetermined orifice 141 and also with the manometer 142 for measuring the pressure on the upstream side of the orifice, the flow rate of circulating gas can be conveniently controlled in conformity with a wide range of conditions.

The method of manufacturing a semiconductor device of this example constructed as explained above, comprises:

exhausting a process chamber;

feeding a process gas to said exhausted process chamber;

applying a high-frequency power to said process gas to generate a plasma to treat a substrate;

exhausting said process gas from the process chamber;

circulating at least part of said process gas that has been exhausted from the process chamber into the process chamber via a circulation path, the circulation path comprising a flow rate control valve, an orifice portion and a manometer measuring a pressure on the upstream side of the orifice portion, the orifice portion being capable of producing a pressure difference of three times or more under an operation condition, the manometer being designed to measure a pressure of process gas on the upstream side of the orifice to give a pressure value thus measured; and adjusting an opening degree of the flow rate control valve on the basis of the pressure value measured to control the flow rate of process gas to be circulated into the process chamber.

EXAMPLE 3

Figure 14:
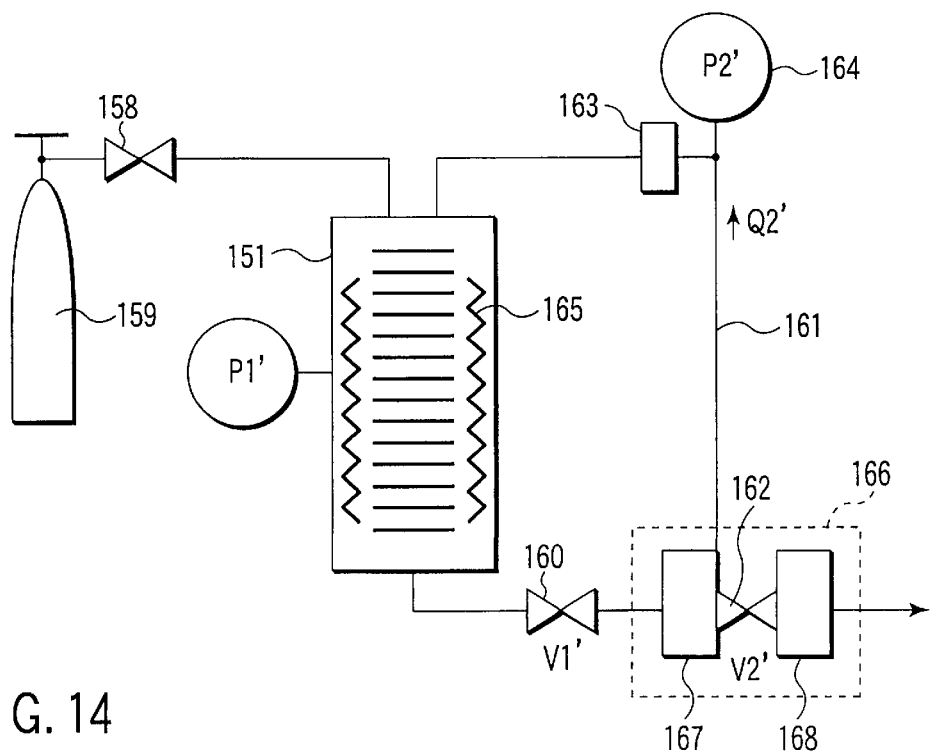
FIG. 14 is a schematical view illustrating a further example of the semiconductor processing apparatus according to another embodiment of the present invention.

FIG. 14 shows the structure of a vertical LPCVD apparatus representing one example of semiconductor processing apparatus according to this example.

In the apparatus shown in FIG. 14, the process chamber 151 is connected via a flow rate control device 158 with a gas cylinder 159 functioning as a supply source for a film-forming process gas as well as for a cleaning gas. As for this process gas, it is possible to employ $SiH_4$, $AsH_3$, etc. Further, a heater 165 for thermally decomposing the process gas is placed inside the process chamber 151.

Additionally, the process chamber 151 is connected via a pressure adjusting valve 160 (V1') with a dry pump 166. This dry pump 166 is constituted by a booster pump 167, a main pump 168, and a flow rate adjusting valve 162 (V2') interposed between these pumps. A circulation piping 161 is interposed between the booster pump 167 and the flow rate adjusting valve 162 (V2'), and is connected with the process chamber 151. This circulation piping 161 is provided with an orifice 163 and a manometer 164 measuring a pressure on the upstream side of the orifice 163.

Next, the procedures for performing the cleaning while circulating a cleaning gas using the vertical LPCVD apparatus will be explained.

When a polycrystalline silicon film for example is formed by the CVD apparatus, the silicon film is permitted to deposit not only on the surface of the substrate but also on the inner wall of the process chamber 151. Therefore, the process chamber 151 is required to be cleaned after every predetermined operation of film-forming treatment to remove the deposited film. In this cleaning treatment, $ClF_3$ gas is employed. This $ClF_3$ gas is an active gas having an etching effect which does not necessitate the discharging thereof by plasma.

Specifically, concurrent with the film-forming process, the ClF$_3$ gas was introduced at first into the process chamber 151 from a cleaning gas inlet port while controlling the flow rate thereof to 200 sccm. Then, the opening degree of the valve 160 (V1') was adjusted so as to control the process pressure P1' inside the process chamber 151 to 10 Torr. On the other hand, by constricting the opening degree of the valve 162 (V2'), the pressure P2' on the upstream side of the orifice of the circulation piping 161 was adjusted to 100 Torr. The pressure on an immediately downstream side of the orifice 163 at this moment was about 20 Torr and then, due to the conductance of the circulation piping 161, was gradually lowered near to 10 Torr which was the process pressure in the process chamber 151.

Further, the opening degree of the valve 160 (V1') was re-adjusted so as to control the process pressure P1' inside the process chamber 151 to 10 Torr. Since the flow rate Q2' of circulating gas when the pressure is P2'=100 Torr was about 1800 sccm, the total gas flow rate to be introduced into the process chamber became 2000 sccm.

As a result, it was possible to obtain a cleaning speed which was almost equivalent to the case where 2000 sccm of gas is introduced into the process chamber 151 without circulating the gas, thereby making it possible to greatly reduce the flow rate of a fresh inlet gas. Incidentally, in the case of this vertical LPCVD apparatus employed in this example, the film-forming is performed under the conditions of: 2 to 10 Torr in pressure, and SiH$_4$=500 sccm or so in inlet gas flow rate.

It was possible to control, on the basis of proportional relationship between the P2' and Q2' that has been investigated in advance, the circulating gas flow rate in conformity with any changes in film-forming conditions even in the operation where the gas is circulated in the film-forming process.

As explained above, even when the exhaust means 166 for exhausting the process chamber is constituted by a booster pump 167, a main pump 168 and a flow rate adjusting valve 162 interposed between these pumps, since the circulation piping 161 is provided with an orifice portion 163 capable of generating a pressure difference of three times or more under operating condition of the apparatus, and also with the manometer 164 for measuring the pressure on the upstream side of the orifice 163, the flow rate of circulating gas can be conveniently controlled in conformity with a wide range of conditions.

EXAMPLE 4

Figure 15:
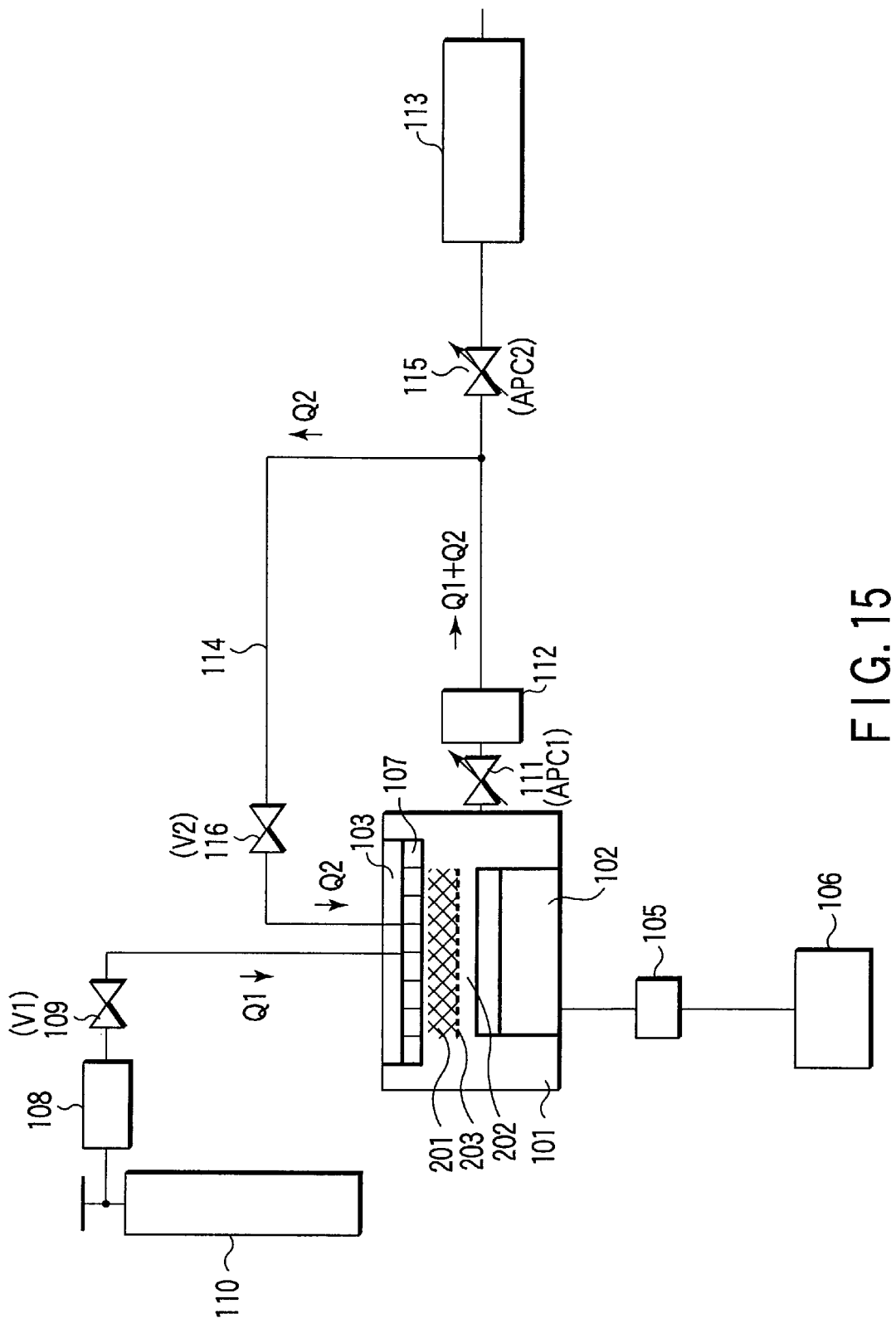
FIG. 15 is a schematical view illustrating the semiconductor processing apparatus employed in Example 4.

FIG. 15 schematically illustrates the structure of a plasma etching apparatus employed in this example, which is provided with a gas circulating mechanism. Incidentally, the explanations on the portions or components which are common to those of FIG. 1 will be omitted herein.

On the occasion of plasma treatment, a process gas is introduced into the process chamber 101, and a high-frequency power from the high-frequency power source 106 is supplied to the process chamber 101, thereby generating a high-frequency field between the anode electrode 103 and the cathode electrode 102, thus forming the plasma of gas. As a result, a bulk plasma 201 and a sheath 202 are formed in the space inside the process chamber 101. This bulk plasma 201 is an electrically neutral plasma wherein the positive electric charge and the negative electric charge are mixed together. In the sheath 202 on the other hand, an electric field which is normal to the cathode electrode 102 is formed. Generally, while the plasma is being kept formed, the dust 203 in the plasma is negatively electrified, thereby enabling the dust 203 to be captured by a boundary surface between the bulk plasma 201 and the sheath 202 in such a manner that the dust 203 is turned away by the electric field of the sheath 202. Therefore, the dust 203 is considered to be exhausted from the process chamber 101 without falling on the surface of wafer disposed on the cathode electrode 102.

However, once the sheath electric field is collapsed, i.e. the moment when the high-frequency power is stopped, the dust that has been generated inside the process chamber 101, or the dust 203 entering inside the process chamber 101 from the circulation piping 114 and being captured by a boundary surface between the bulk plasma 201 and the sheath 202 is allowed to fall and adhere to the wafer. However, the dust thus adhered onto the wafer can be hardly removed, thereby lowering the yield of the device.

Next, the procedures (sequence) for performing the etching treatment according to this example using the apparatus shown in FIG. 15 will be explained with reference to FIG. 16.

During the idling time ("a" in FIG. 16) between treatments, the on-off valves V1 and V2 are kept closed, whereas the automatic pressure adjusting valves APC1 and APC2 are fully opened. By doing this, the pressure P1 inside the process chamber 101 and the pressure P2 inside the circulation piping 114 reaches base pressure.

Then, in the step of gas introduction/pressure adjustment (shown as "b" in FIG. 16), the V1 is opened to feed C$_4$F$_8$, CO, Ar and O$_2$ gases at a desired ratio from the gas cylinder 110 to the process chamber 101 through the flow rate controller 108, and at the same time, the pressure P1 in the process chamber 101 is controlled to the specified value by the automatic pressure control valve 111 (APC1). Concurrently, the opening degree of the automatic pressure control valve 115 (APC2) is adjusted so as to allow a predetermined ratio (for example, 80%) of the exhaust gas exhausted from the process chamber 101 by the turbo molecular pump 112 is permitted to return into the process chamber 101 through the circulation path comprising the circulation piping 114 and the valve V2. When these pressures P1 and P2 are stabilized, a high-frequency power is applied to the process chamber 101 (shown as "c" in FIG. 16), thereby initiating the etching process.

After a predetermined period of treatment, the valve V2 is closed to suspend the re-entry of gas (shown as "f" in FIG. 16), and subsequently, the high-frequency power is stopped (shown as "d" in FIG. 16). The time required for these procedures is indicated by "t" in FIG. 16. The APC2 is fully opened at this time. Then, the valve V1 is closed, and the APC1 is fully opened (shown as "e" in FIG. 16). In this manner, the gas inside the process chamber 101 and the circulation piping 114 completely exhausted therefrom.

According to this example, the treatment was performed by suspending the circulation of the gas prior to stopping the high-frequency power. As a result, even if dust was more or less permitted to generate in the circulation path and to enter into the process chamber 101, there was little possibility that the dust was allowed to fall and adhere to the surface of wafer. As a result, the time intervals for cleaning or exchanging the circulation piping 114 could be prolonged twice.

Figure 16:
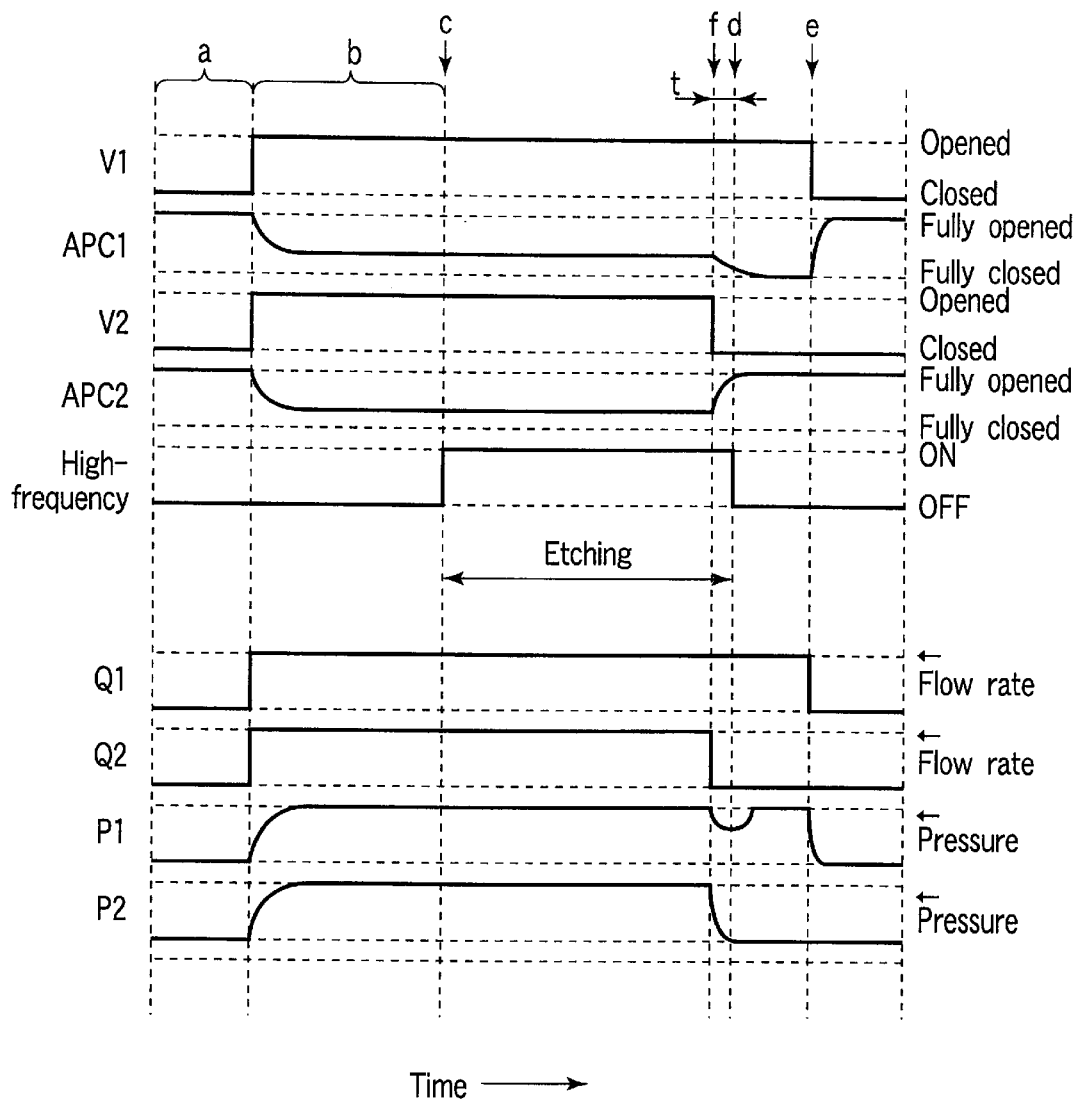
FIG. 16 is a diagram illustrating one example of a sequence of etching treatment shown in Example 4.

As seen from FIG. 16, the shorter the time interval "t" between the suspension of the circulation of gas and the stopping the high-frequency power, the smaller the influence on etching performance. On the other hand, for the purpose of enhancing the dust preventing effect, "t" should preferably be the residence time of gas under the treatment condition, V×P×60/(760×Q) sec or more (wherein V is the volume of process chamber (L); P is a pressure (Torr); and Q is a gas flow rate (slm)). Typically, the residence time may be 14 μs under the conditions of: V=3.1 L, P=40×10$^{-3}$, and Q=700 slm.

EXAMPLE 5

The procedures (sequence) for performing the etching treatment according to this example using the apparatus shown in FIG. 15 will be explained with reference to FIG. 17.

During the idling ("a" in FIG. 17) between treatments, the on-off valves V1 and V2 are kept closed, whereas the automatic pressure adjusting valves APC1 and APC2 are fully opened. By doing this, the pressure P1 inside the process chamber 101 and the pressure P2 inside the circulation piping 114 reaches base pressure.

Then, in the step of gas introduction/pressure adjustment (shown as "b" in FIG. 17), the V1 is opened to feed $C_4F_8$, CO, Ar and $O_2$ gases at a desired ratio from the gas cylinder 110 to the process chamber 101 through the flow rate controller 108, and at the same time, the pressure P1 in the process chamber 101 is adjusted to a suitable degree by the automatic pressure control valve 111 (APC1). Concurrently, the opening degree of the automatic pressure control valve 115 (APC2) is adjusted so as to allow a predetermined ratio (for example, 80%) of the exhaust gas exhausted from the process chamber 101 by the turbo molecular pump 112 is permitted to return into the process chamber through the circulation path comprising the circulation piping 114 and the valve V2. When these pressures P1 and P2 are stabilized, a high-frequency power is applied to the process chamber 101 (shown as "c" in FIG. 17), thereby initiating the etching process.

After a predetermined period of treatment, the valve V2 is closed to suspend the re-entry of gas and at the same time, the gas supply flow rate Q1 is increased (shown as "f" in FIG. 17). Subsequently, the high-frequency power is stopped (shown as "d" in FIG. 17). The time required for these procedures is indicated by "t" in FIG. 17. The APC2 is fully opened at this time. Then, the valve V1 is closed, and the APC1 is fully opened (shown as "e" in FIG. 17). In this manner, the gas inside the process chamber 101 and the circulation piping 114 is completely exhausted therefrom.

According to this example, the Q1 flow rate is increased concurrent with the suspension of the circulation of the gas through the closing of the valve V2. As a result, it becomes possible to substantially eliminate the fluctuation of pressure, and at the same time, to inhibit the device from being damaged due to an abnormal discharging resulting from the instabilization of plasma.

EXAMPLE 6

FIG. 18 schematically illustrates the semiconductor processing apparatus employed in this example. Incidentally, the explanations on the portions or components which are common to those of FIG. 1 will be omitted herein.

As shown in FIG. 18, a piping 225 disposed on the gas-exhaust side of a vacuum pump 112 is branched at a junction 226 into a piping 227 extending toward the an vacuum pump 113 and a piping 114 for circulating a gas. The gas circulating ratio can be controlled by adjusting the opening degree of a variable valve 115 employed for adjusting a back pressure.

A passage of the exhausted process gas includes the piping 225, the piping 227 and the piping 114, valves 111 and 115 and vacuum pumps 112 and 113.

The chamber 101 is connected with a piping 231 for introducing a process gas to be employed for etching treatment or a cleaning treatment gas into the chamber 101. The process gas for etching treatment is fed from a gas source 110 such as a gas cylinder into the chamber 101 via a mass flow controller 108 and a valve 109. Whereas the cleaning treatment gas is fed from a gas source 235 such as a gas cylinder into the chamber 101 via a mass flow controller 236 and a valve 237. As for this cleaning treatment gas, it is possible to employ a chemically active gas directly fed to the process chamber 101. Alternatively, a stable gas may be fed as the cleaning treatment gas into the process chamber 101. This gas can be activated by plasma discharge in the process chamber 101.

It is also possible to employ the process gas to be employed for etching treatment as a cleaning treatment gas in the cleaning process by changing the conditions for these etching and cleaning treatments. In this case, the aforementioned couple of gas introducing lines may be made into a common line.

Each of the aforementioned components can be controlled by a control device 241. In this control device 241, the accumulated etch process time is counted, and as the total time has reached a predetermined provided period, the information thereof is transmitted therefrom. The expression of "etch process time" in this case means the time required for the etching without the circulation of process gas, the time required for the etching accompanied with the circulation of process gas, or a total time of both. On the other hand, the provided time expire before the deposit becomes dust after the peeling thereof as described below.

During the etching process, a deposit originating from a process gas is allowed to deposit on the inner surfaces of the piping 225, the piping 227, the piping 114 or the valves installed on these piping system (for example 115). Depending on the components included in the process gas, the deposit contains carbon or silicon. The deposit will peel-off beyond critical thickness from the inner surfaces of the piping or valve described above and turn into dust.

The aforementioned "provided period" expires before the deposit becomes dust by peeling thereof from the inner walls of the passage of the exhausted process gas such as piping and valves. These piping or valves may be provided with a function which determines, on the basis of the results detected by a predetermined detecting means, whether or not the deposited state of deposit at a predetermined region has reached the provided condition. The "provided condition" in this case also means a condition just before where the aforementioned deposit is turned into dust by being peeled away from the inner wall of the passage of the exhausted process gas such as piping, etc.

Next, the method of manufacturing the semiconductor device of this example using the apparatus shown in FIG. 18 will be explained.

In a step where the etching time was less than 15 seconds, the etching treatment was performed in the ordinary mode without the circulation of gas, whereas in a step where the etching time was not less than 15 seconds, the etching treatment was performed in a mode accompanying the circulation of gas. The reason for taking the procedures is that it has been confirmed that the gas circulating mode is more advantageous in a step where the etching time takes not less than 15 seconds in view of reducing the quantity of PFC gas to be fed or exhausted as well as in view of enhancing the through-put of the apparatus.

In a contact etching step where the etching time was 30 seconds, an oxide film formed on a semiconductor wafer was etched using the gas circulating mode and under the following conditions. Namely, as an etching process gas, $CF_4/O_2/Ar$ were introduced at a flow rate of 16/2/40 sccm, respectively, into the process chamber 101 through a gas-introducing system comprising the gas source 110, the mass flow controller 108, valve 109 and the piping 231. The high-frequency power was set to 1200 W, and the inner pressure of the process chamber 101 was set to 40 mTorr. On the occasion, the opening degree of the variable valve 115 was adjusted so as to set the inner pressure of the circulation piping 114 to 5 Torr, and at the same time, the gas circulation ratio (Q2/(Q1+Q2)) was adjusted to 80% so as to render the total gas flow rate into the process chamber 101 to become 290 sccm.

Further, in another etching step where the etching time was 12 seconds, the etching was performed using the ordinary mode where the circulation of gas was not accompanied. On this occasion, the quantity of feed gases $CF_4/O_2/Ar$ from the gas-introducing system into the chamber was set to 80/10/200 sccm.

In this manner, while the etching treatment was performed using the ordinary mode or the gas-circulating mode, the etching treatment time in each of the ordinary mode or the gas-circulating mode was counted by the control device 241 to accumulate.

When the total of the etching time in the etchings of the ordinary mode and the gas-circulating mode reached 70 hours, a prescribed information indicating this fact was transmitted from the control device 241. At this stage, the interior of the chamber 101 was released to air atmosphere, and a deposited film such as a fluorocarbon film deposited on the inner wall of the chamber 101 was removed.

Further, when the total of the etching time in the etching of the gas-circulating mode was reached 200 hours, the cleaning of the passage of the circulated process gas was performed using an active gas as follows.

First of all, as a cleaning gas, $SF_6/O_2$ were introduced from a gas-introducing system into the chamber 101. The gas flow rate was set to 200/20 sccm, and the pressure inside the chamber 101 was controlled to 500 mTorr. Additionally, a plasma discharging was performed with a high-frequency power of 800 W. On this occasion, the opening degree of the variable valve 115 was controlled so as to set the pressure inside the circulation piping 114 to 5 Torr.

Fluorine radical (F*) generated by the high-frequency discharge functioned as an active gas. Namely, due to the effects by the fluorine radical (F*), the deposited film mainly comprising Si such as Si film or SiO film that had been adhered on the inner walls of the chamber 101, the valve 111, the vacuum pump 112, the piping 225, 227 and 114, and the variable valve 115 was etched away through the reaction of: $Si+4F^* \rightarrow SiF_4$. It was possible in this manner to prevent in advance the generation of problems such as the peeling of film or clogging.

Then, as a cleaning gas, $CF_4/O_2$ were introduced from a gas-introducing system into the chamber 101. The gas flow rate was set to 5/200 sccm, and the pressure inside the chamber 101 was controlled to 500 mTorr. Additionally, a plasma discharging was performed with a high-frequency power of 1200 W. On this occasion, the opening degree of the variable valve 115 was controlled so as to set the pressure inside the circulation piping 114 to 1 Torr, thereby enabling the oxygen radical (O*) generated by the high-frequency discharging in the chamber 101 to reach as far away as possible without being inactivated.

Oxygen radical (O*) generated by the high-frequency discharge functioned as an active gas. Namely, due to the effects by the oxygen radical (O*), the deposited film mainly comprising carbon that had been adhered on the inner walls of the chamber 101, the valve 111, the vacuum pump 112, the piping 225, 227 and 114, and the variable valve 115 was etched away through the reaction of: $C+O^* \rightarrow CO$; $C+O_2 \rightarrow CO_2$. It was possible in this manner to prevent in advance the generation of problems such as the peeling of film or clogging.

Since the passage of the exhausted process gas was cleansed by an active gas at the stage in this manner when the total time of the etching treatment with gas-circulation mode had reached a provided time, it was possible to prevent the deterioration of yield of semiconductor device that might have been caused by the dust to be generated from the peeling thereof. Moreover, it has become possible to effectively perform the maintenance of the piping, valves, pumps, etc.

Incidentally, it is preferable to prevent reaction product (such as $SiF_4$) from being newly generated from the chamber 101 on the occasion of performing the cleaning. For this purpose, the wafer 104 to be mounted on a lower electrode 102 should preferably be selected from those having thereon a film containing no Si and exhibiting a relatively low etching speed. Further, when a wafer having a silicon oxide film thereon is to be employed, the discharging should preferable be performed under a condition where the ion energy is as low as possible.

It is also possible to substitute $CF_4$ for the $SF_6$. As a result, the cost involved for feeding $SF_6$ for exclusively using for the cleaning can be saved in a system where $SF_6$ is not employed as process gas.

It is also possible to change the gas to be employed in the cleaning in conformity with the components of the deposited film which may be altered depending on the operation of the system. For example, the time allocation between a cleaning process mainly using fluorine radical and a cleaning process mainly using oxygen radical may be optimized, thus performing these cleaning processes alternately, repeating plural times.

EXAMPLE 7

The method of manufacturing the semiconductor device of this example using the apparatus shown in FIG. 18 will be explained.

In this example, the state of deposition at a region where the cleaning cycle is rate-determined is monitored, thereby making it possible to determine the cleaning time. The region to be monitored should preferably be selected from those regions where a film can be easily deposited, i.e. the regions where the pressure is relatively high. Specifically, the state of deposition on the downstream side of the vacuum pump 112, i.e. predetermined portions of the piping 225, 227 and 114 or the variable valve 115 should preferably be monitored.

It has been found that in some system, the cleaning cycle is rate-determined due to the peeling of deposited film at the variable valve 115 shown in FIG. 18, which is caused by the closing and opening operation of the variable valve 115. In this variable valve 115, as the deposited film becomes thicker, the conductance is caused to alter under the condition where the valve is nearly completely closed. Therefore, the state of deposited film was monitored as follows.

Namely, the opening degree of the variable valve 115 was tested periodically, for example, once a week, so as to render the circulating gas flow rate to become a prescribed flow rate under a high circulation ratio, and the resultant opening degree was monitored. Specifically, $N_2$ gas was introduced from the piping 231 into the chamber 101 at a flow rate of 20 sccm, and the opening degree of the variable valve 115 was adjusted so as to render the circulation ratio to become 95%. Subsequently, when the opening degree of the variable valve 115 on this occasion became plus 10% based on the opening degree thereof at the moment immediately after the cleaning of the circulation system, the cleaning of the circulation system was performed by an active gas.

In the case where the cleaning cycle is rate-determined by the deposited film at the vicinity of the outlet port of the compressed gas (point A in FIG. 18) located on the downstream side of the turbo molecular pump 112, the monitoring of the state of the depositating film at this location is more effective. In particular, in the case where the rotation of the pump is affected by the deposited film, the state of the deposited film can be monitored by monitoring the rotational speed of the pump or the supply current to the pump.

It is also possible to monitor the state of the deposited film by monitoring the thickness of the deposited film formed on the inner walls of the piping 225, 227 and 114 optically. One example of this monitoring method is shown in FIG. 19. In this example, an optical means is positioned at the point "A" of the piping 225. Namely, a pair of transparent glass windows 251 and 252 were placed face to face on the piping 225, and the light from a light source 253 disposed at the glass window 251 was directed to a light receptor 254. By the phenomenon that the magnitude of light received by the receptor 254 varies depending on the thickness of the deposited film that has been adhered onto the inner wall of the piping 225, i.e. the inner wall of the glass windows 251 and 252, the thickness of the deposited film can be detected.

Alternatively, it is possible to monitor the state of the deposited film by optically monitoring the surface roughness of the deposited film.

As explained above, according to this example, the deposited state such as the thickness of the deposited film is monitored. As a result, the cleaning timing of circulation system by an active gas can be precisely determined even if the process condition of the etching treatment is caused to change in the midway of the cleaning treatments due to reasons such as the changes in kind of articles to be treated.

In Examples 6 and 7, examples where the cleaning was performed by fluorine radical or oxygen radical to be generated by high-frequency discharge, i.e. examples where a non-active gas was activated by discharge in a chamber 101 have been explained. However, as mentioned above, an active gas may be directly introduced into the chamber 101. In this case, without necessitating the activation of gas by high-frequency discharging, a gas which is capable of dry-etching a deposit containing silicon is employed as an active gas.

For example, when a film of silicon oxide-based deposit is to be etched, the employment of a HF gas is effective. By using this HF gas, an etching rate of the silicon oxide-based deposit is increased up to 10 to 100 times. Moreover, since it is no longer necessitated to employ the discharging inside the chamber 101, there is no possibility that the wafer 104 mounted on a lower electrode 102 can be etched.

Additionally, it is also possible to prevent $SiF_4$ from being newly produced. In this case, the HF gas may be introduced into the chamber 101 from the piping 231 and then, may be re-cycled. Alternatively, the a piping 229 may be attached to the passage of the exhausted process gas, for example, to the vacuum pump 112 or to the downstream side of the vacuum pump 112, thereby enabling the HF gas to be introduced therefrom.

As for the active gas, it is possible to employ $F_2$ gas or $ClF_3$ gas, other than HF gas.

Although this invention has been explained with reference specific examples, this invention can be variously modified within the spirit of this invention, and in any of these modifications, the effects of this invention can be obtained likewise.

As explained above, it is possible according to this invention to provide a semiconductor processing apparatus which is capable of preventing dust from entering into a process chamber, and preventing dust from adhering onto a wafer, thus preventing the deterioration of yield, without necessitating frequent exchange or cleaning of the circulation piping. Therefore, it becomes possible according to the semiconductor processing apparatus of this invention to reduce the manufacturing cost and the environmental load. Further, it is possible according to this invention to provide a method of manufacturing a semiconductor device, which is capable of reducing the quantity of process gas to be employed while making it possible to reproducibly control the flow rate of the circulating gas by a simple method. Therefore, it becomes possible according to the method of this invention to reduce the manufacturing cost and the environmental load.

This invention would be useful in particular for the manufacturing process of semiconductor device wherein a substrate is treated by plasma in a plasma etching apparatus, a plasma CVD apparatus, etc., and therefore, this invention would be very valuable in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

exhausting a process chamber;

feeding a process gas to said exhausted process chamber;

applying a high-frequency power to said process gas to generate a plasma to treat a substrate;

exhausting said process gas from said process chamber;

circulating at least part of said process gas that has been exhausted from said process chamber to said process chamber;

suspending the circulation of said process gas to said process chamber; and stopping the application of said high-frequency power subsequent to the suspension of the circulation of said process gas.

2. The method according to claim 1, wherein a flow rate of process gas to be fed to said process chamber is increased concurrent with the suspension of the circulation of said process gas to said process chamber to minimize the fluctuation of pressure inside said process chamber.

3. A method of manufacturing a semiconductor device, comprising:

exhausting a process chamber;

feeding a process gas to said exhausted process chamber;

applying a high-frequency power to said process gas to generate a plasma for treating a substrate;

exhausting said process gas from said process chamber;

circulating at least part of said process gas that has been exhausted from said process chamber, to said process chamber via a circulation path, a deposit from said process gas being allowed to deposit inside a passage of said exhausted process gas;

accumulating the time taken to treat said substrate while circulating said process gas; and circulating an active gas as the time accumulated reaches a provided period, to allow said active gas to react with said deposit formed inside said passage of said exhausted process gas to remove said deposit.

4. The method according to claim 3, wherein said provided period expire before said deposit starts peeling from inside said passage of said exhausted process gas and turned into dust.

5. The method according to claim 3, wherein said active gas is produced by activating a non-active gas fed to said chamber and subjected to discharging.

6. The method according to claim 5, wherein said non-active gas comprises at least one of a fluorine-containing gas capable of etching a silicon-containing deposit and an oxygen-containing gas capable of etching a carbon-containing deposit.

7. The method according to claim 6, wherein said fluorine-containing gas and said oxygen-containing gas are alternately passed through said passage of said exhausted process gas at least once.

8. The method according to claim 6, wherein said fluorine-containing gas produces a fluorine radical through said discharging, and said oxygen-containing gas produces an oxygen radical through said discharging.

9. The method according to claim 3, wherein said active gas is fed directly to said process chamber.

10. The method according to claim 9, wherein said active gas comprises a gas capable of etching a silicon-containing deposit.

11. The method according to claim 10, wherein said gas capable of etching a silicon-containing deposit is selected from the group consisting of HF, $F_2$ and $ClF_3$.

12. A method of manufacturing a semiconductor device, comprising:

exhausting a process chamber;

feeding a process gas to said exhausted process chamber;

applying a high-frequency power to said process gas to generate a plasma for treating a substrate;

exhausting said process gas from said process chamber;

circulating at least part of said process gas that has been exhausted from said process chamber, to said process chamber via a circulation path, a deposit from said process gas being allowed to deposit inside a passage of said exhausted process gas;

monitoring a thickness of said deposit thus deposited; and circulating an active gas as being monitored that said thickness of said deposit reaches a provided thickness to allow said active gas to react with said deposit deposited inside said passage of said exhausted process gas to remove said deposit.

13. The method according to claim 12, wherein said circulation of said process gas is performed using a vacuum pump and a variable valve, and said thickness of said deposit is monitored on the basis of opening degree of said variable valve, said opening degree being equivalent to that where a gas of predetermined flow rate is passed through said passage of said exhausted process gas.

14. The method according to claim 12, wherein said active gas is produced by activating a non-active gas fed to said chamber and subjected to discharging.

15. The method according to claim 14, wherein said non-active gas comprises at least one of a fluorine-containing gas capable of etching a silicon-containing deposit and an oxygen-containing gas capable of etching a carbon-containing deposit.

16. The method according to claim 15, wherein said fluorine-containing gas and said oxygen-containing gas are alternately passed through said passage of said exhausted process gas at least once.

17. The method according to claim 15, wherein said fluorine-containing gas produces a fluorine radical through said discharging, and said oxygen-containing gas produces an oxygen radical through said discharging.

18. The method according to claim 12, wherein said active gas is fed directly to said process chamber.

19. The method according to claim 18, wherein said active gas comprises a gas capable of etching a silicon-containing deposit.

20. The method according to claim 19, wherein said gas capable of etching a silicon-containing deposit is selected from the group consisting of HF, $F_2$ and $ClF_3$.

* * * * *